US012648216B2

(12) United States Patent
Cheng et al.

(10) Patent No.: US 12,648,216 B2
(45) Date of Patent: Jun. 2, 2026

(54) METHOD FOR FORMING SEMICONDUCTOR DEVICE STRUCTURE

(71) Applicant: Taiwan Semiconductor Manufacturing Company, Ltd., Hsinchu (TW)

(72) Inventors: Chia-Yun Cheng, Hsinchu City (TW); I-Ming Chang, ShinChu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 457 days.

(21) Appl. No.: 18/315,524

(22) Filed: May 11, 2023

(65) Prior Publication Data

US 2024/0379443 A1    Nov. 14, 2024

(51) Int. Cl.
H10D 84/03 (2025.01)
H10D 64/01 (2025.01)
H10D 84/01 (2025.01)

(52) U.S. Cl.
CPC ......... H10D 84/038 (2025.01); H10D 64/017 (2025.01); H10D 84/013 (2025.01); H10D 84/0151 (2025.01); H10D 84/0158 (2025.01)

(58) Field of Classification Search
None
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2017/0207126 A1* | 7/2017 | Ching ................ | H10D 30/6219 |
| 2018/0151699 A1* | 5/2018 | Lu ..................... | C23C 16/45525 |
| 2021/0233997 A1* | 7/2021 | Chen ................. | H01L 21/31116 |

* cited by examiner

*Primary Examiner* — Shahed Ahmed
*Assistant Examiner* — Lamont B Koo
(74) *Attorney, Agent, or Firm* — Birch, Stewart, Kolasch & Birch, LLP

(57) ABSTRACT

A method for forming a semiconductor device structure includes forming a fin structure over a substrate. The method also includes forming a dummy gate structure across the fin structure. The method also includes depositing a spacer layer over the fin structure and the dummy gate structure. The method also includes implanting dopants into the spacer layer to form a first doped region vertically overlapping the dummy gate structure and a second doped region over the fin structure without vertically overlapping the dummy gate structure. A middle region of the spacer layer connects the first doped region and the second doped region. The method also includes removing the first doped region and the second doped region of the spacer layer. The method also includes forming a source/drain structure attached to the fin structure after removing the first doped region and the second doped region of the spacer layer.

20 Claims, 45 Drawing Sheets

106
104
102

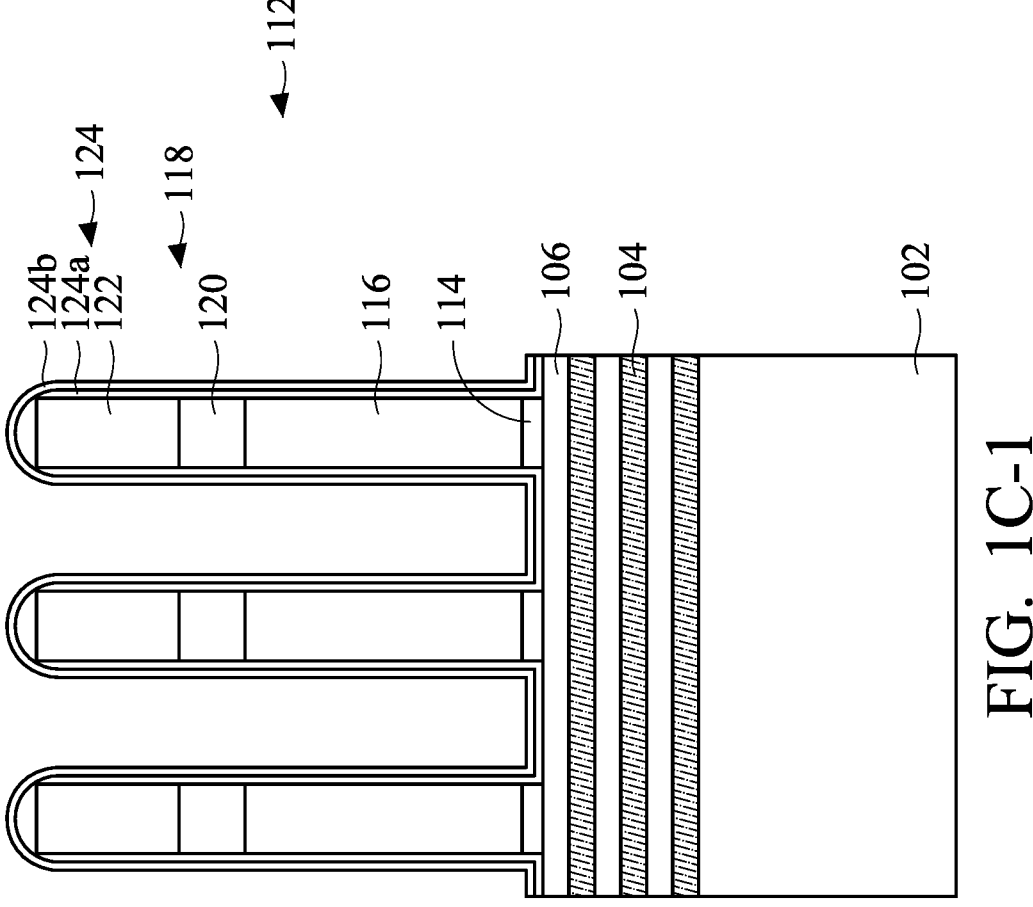
124b
124a 124
122
120 118
112
116
114
106
104
102
FIG. 1C-1
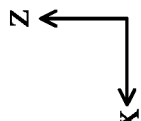

10a 124
122
118
120

116

114

106

104

112

102

128 z x

10b

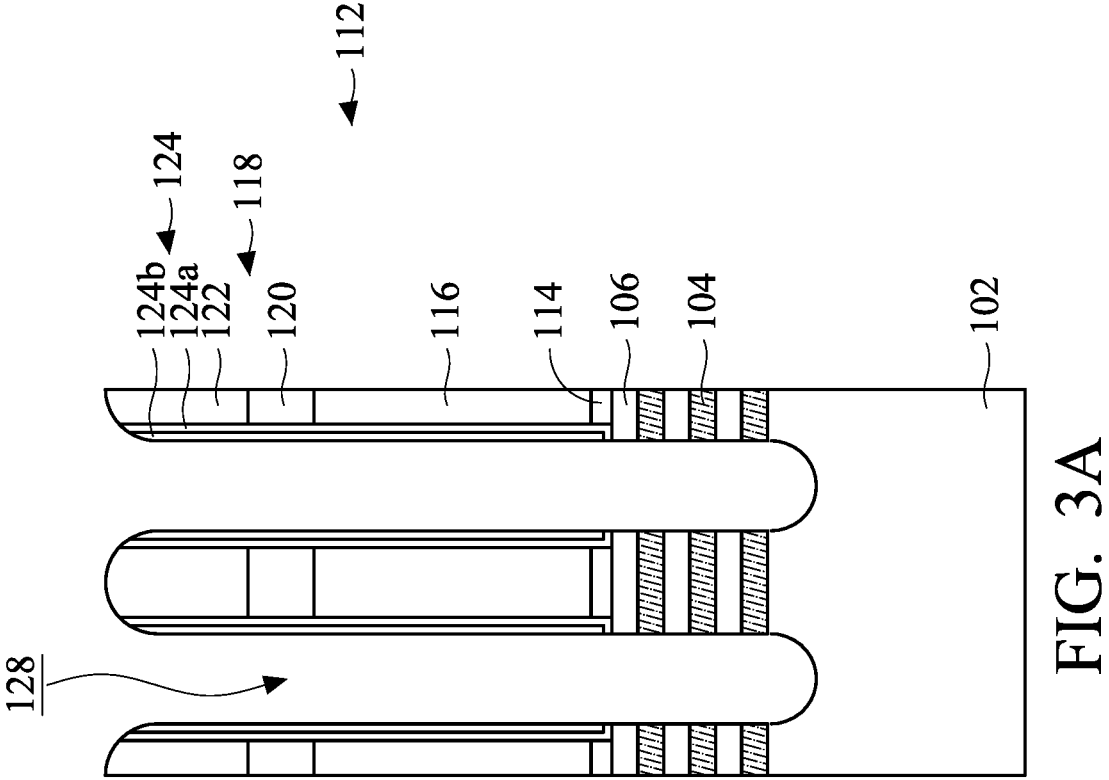
124b
124a    } 124
122
118
112
120
116
114
106
104
128
102
FIG. 3A
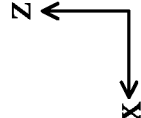

126

132d
124b ⎫
124a ⎬ 124
122 ⎭
120
132
116
114
106
104
132d
102

118

112

128 z ← x

10c 124b
124a
124
122
120
118
116
114
112
106
104
102

METHOD FOR FORMING SEMICONDUCTOR DEVICE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semi-conductive layers of material over a semiconductor sub-strate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Recently, multi-gate devices have been introduced in an effort to improve gate control by increasing gate-channel coupling, reduce OFF-state current, and reduce short-chan-nel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconduc-tor (CMOS) processes.

However, integration of fabricating of the GAA features around the nanowire can be challenging. While the current methods being employed have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1C-1, 1D-1, 1E-1, 1F-1, 1G-1, 1I-1, 1J-1 are cross-sectional representations of various stages of forming a semiconductor device structure, in accordance with some embodiments of the disclosure.

FIGS. 1C-2, 1D-2, 1E-2, 1F-2, 1G-2 are cross-sectional representations of various stages of forming a semiconduc-tor device structure, in accordance with some embodiments of the disclosure.

FIGS. 2A-1, 2B-1, 2C-1, 2D-1, 2E-1 are cross-sectional representations of various stages of forming a semiconduc-tor device structure, in accordance with some embodiments of the disclosure.

FIGS. 3A, 3B, 3C, 3D, 3E are cross-sectional represen-tations of various stages of forming a semiconductor device structure, in accordance with some embodiments of the disclosure.

FIGS. 3A-1, 3B-1, 3C-1, 3D-1, 3E-1 are cross-sectional representations of various stages of forming a semiconduc-tor device structure, in accordance with some embodiments of the disclosure.

FIG. 4A-1 is a cross-sectional representation of forming a semiconductor device structure, in accordance with some embodiments of the disclosure.

DETAILED DESCRIPTION

Figure 1A:
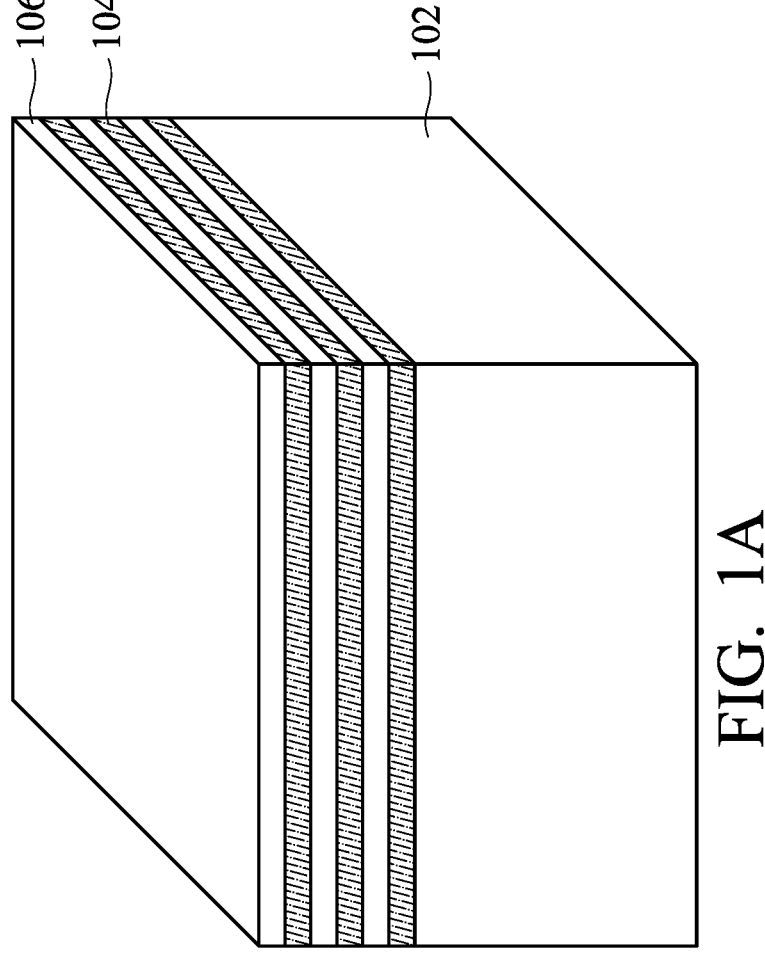
FIGS. 1A, 1B, 1C, 1D, 1E, 1F, 1G, 1H, 1I, 1J are perspective representations of various stages of forming a semiconductor device structure, in accordance with some embodiments of the disclosure.
Figure 1A:
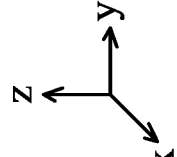

The following disclosure provides many different embodiments, or examples, for implementing different fea-tures of the subject matter provided. Specific examples of components and arrangements are described below to sim-plify the present disclosure. These are, of course, merely examples and are not intended to be limiting. For example, the formation of a first feature over or on a second feature in the description that follows may include embodiments in which the first and second features are formed in direct contact, and may also include embodiments in which addi-tional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The nanostructure transistor (e.g. nanosheet transistor, nanowire transistor, multi-bridge channel, nano-ribbon FET, forksheet structures, gate all around (GAA) transistor struc-tures) described below may be patterned by any suitable method. For example, the structures may be patterned using one or more photolithography processes, including double-patterning or multi-patterning processes. Generally, double-patterning or multi-patterning processes combine photoli-thography and self-aligned processes, allowing patterns to be created that have, for example, smaller pitches than what is otherwise obtainable using a single, direct photolithogra-phy process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructures.

Embodiments for forming a semiconductor device struc-ture are provided. The method for forming the semiconduc-tor device structure may include implanting dopants into a spacer layer and wet etching the doped region when forming the source/drain recess. The remain fin spacers may be higher, and the source/drain epitaxial structures may not be merged. In addition, the capacitance may be decreased.

The semiconductor device structure 10a may be a nano-structure transistor. FIGS. 1A, 1B, 1C, 1D, 1E, 1F, 1G, 1H, 1I, 1J are perspective representations of various stages of forming the semiconductor device structure 10a, in accordance with some embodiments of the disclosure. FIGS. 1C-1, 1D-1, 1E-1, 1F-1, 1G-1, 1I-1, 1J-1 are cross-sectional representations of various stages of forming a semiconductor device structure 10a, in accordance with some embodiments of the disclosure. FIGS. 1C-2, 1D-2, 1E-2, 1F-2, 1G-2 are cross-sectional representations of various stages of forming a semiconductor device structure 10a, in accordance with some embodiments of the disclosure. FIGS. 1C-1, 1D-1, 1E-1, 1F-1, 1G-1, 1I-1, 1J-1 show cross-sectional representations taken along line 1-1 in FIGS. 1C, 1D, 1E, 1F, 1G, 1H, 1I, 1J, respectively. FIGS. 1C-2, 1D-2, 1E-2, 1F-2, 1G-2 show cross-sectional representations taken along line 2-2 in FIGS. 1C, 1D, 1E, 1F, 1G, respectively.

A semiconductor stack including first semiconductor material layers 104 and second semiconductor material layers 106 are formed over a substrate 102, as shown in FIG. 1A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, alternating first semiconductor material layers 104 and second semiconductor material layers 106 are stacked over the substrate 102. The first semiconductor material layers 104 and the second semiconductor material layers 106 may include Si, Ge, SiGe, GaAs, InSb, GaP, GaSb, InAlAs, InGaAs, GaSbP, GaAsSb, or InP. The first semiconductor material layers 104 and second semiconductor material layers 106 may be made of different materials with different etching rates. In some embodiments, the first semiconductor material layers 104 include SiGe and the second semiconductor material layers 106 include Si.

The first semiconductor material layers 104 and second semiconductor material layers 106 may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of the first semiconductor material layers 104 and three layers of the second semiconductor material layers 106 shown in FIGS. 1A, the number of the first semiconductor material layers 104 and second semiconductor material layers 106 are not limited herein, depending on the demand of performance and process. For example, the semiconductor structure may include two to five layers of the first semiconductor material layers 104 and two to five layers of the second semiconductor material layers 106.

Figure 1B:
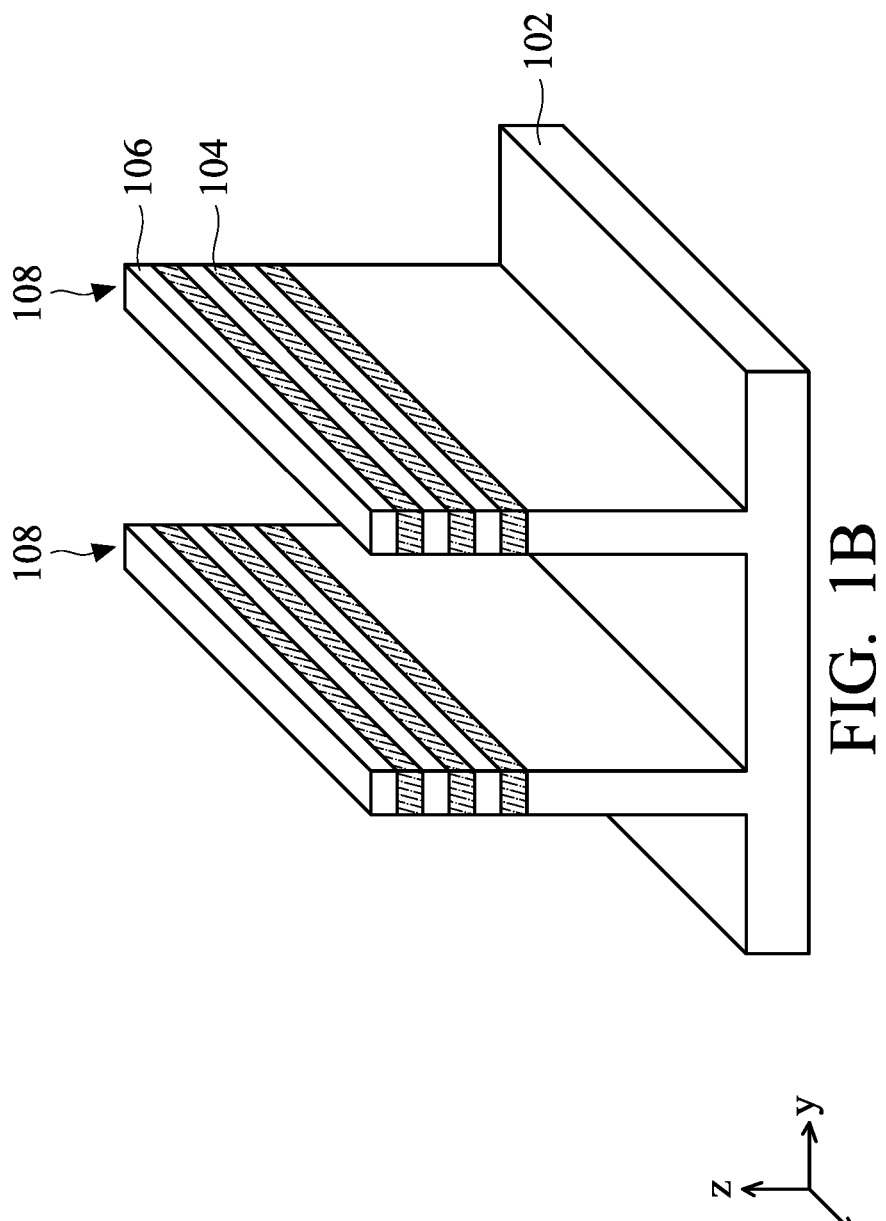

Next, a hard mask layer may be formed and patterned over the first semiconductor material layers 104 and second semiconductor material layers 106 (not shown). The first semiconductor material layers 104 and second semiconductor material layers 106 may be patterned to form fin structures 108 using the patterned hard mask layer as a mask layer, as shown in FIG. 1B in accordance with some embodiments. The patterning process may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

After the fin structures 108 are formed, a liner layer may be formed in the trenches between the fin structures 108 (not shown). The liner layer may be conformally formed over the substrate 102, the fin structure 108, and the hard mask layer covering the fin structure 108. The liner layer may be used to protect the fin structure 108 from being damaged in the following processes (such as an anneal process or an etching process). The liner layer may be made of silicon nitride. The liner layer may be formed by using a thermal oxidation, a CVD process, an atomic layer deposition (ALD) process, a LPCVD process, a plasma enhanced CVD (PECVD) process, a HDPCVD process, a flowable CVD (FCVD) process, another applicable process, or a combination thereof.

Next, an isolation structure material 110 may be then filled over the liner layer in the trenches between the fin structures 108. The isolation structure material 110 may be made of silicon oxide, silicon nitride, silicon oxynitride, fluoride-doped silicate glass (FSG), or another low-k dielectric material. The isolation structure material 110 may be deposited by a deposition process, such as a chemical vapor deposition (CVD) process, a spin-on-glass process, or another applicable process.

Figure 1C:
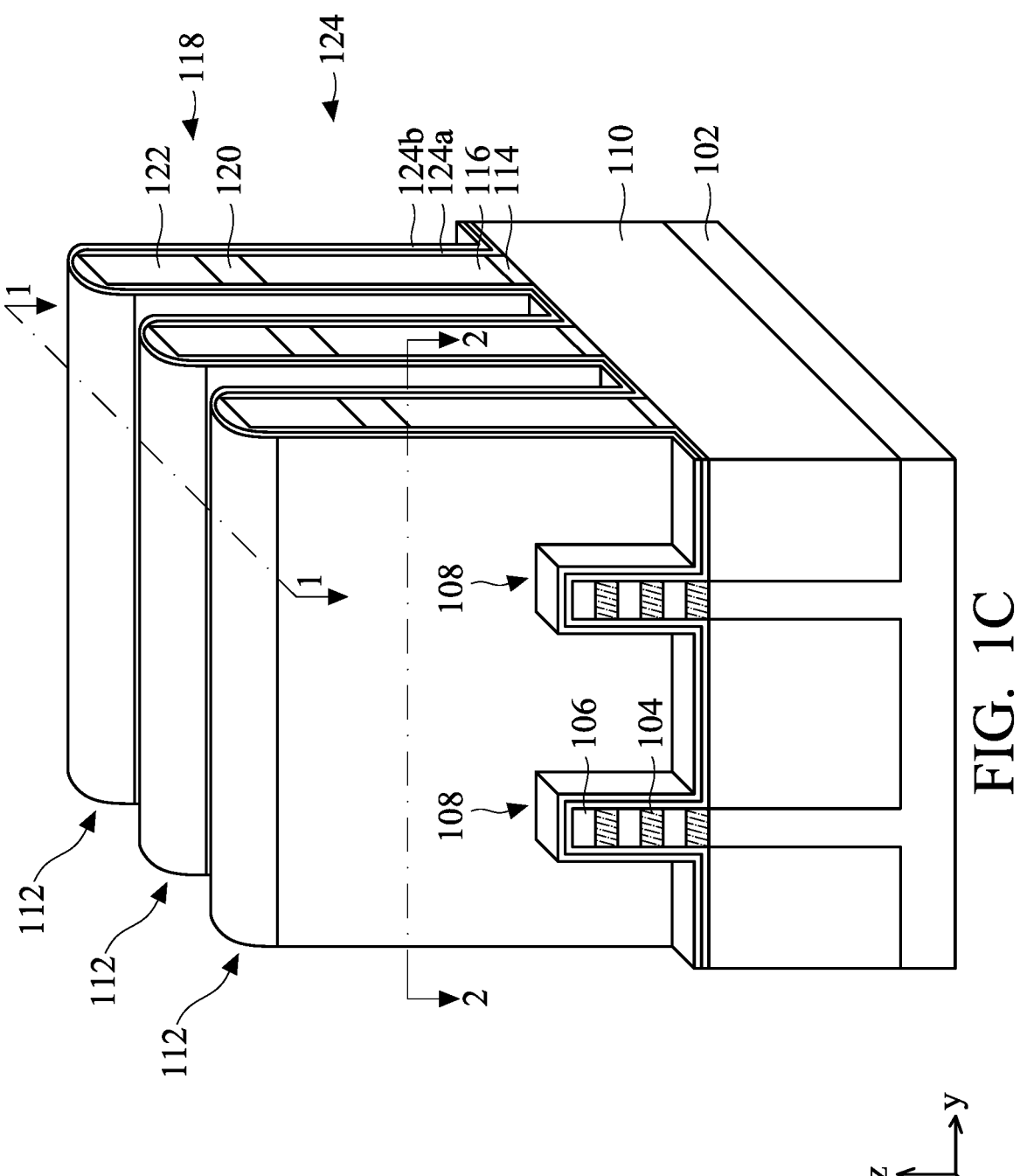
Figures 1, 1C, 2:
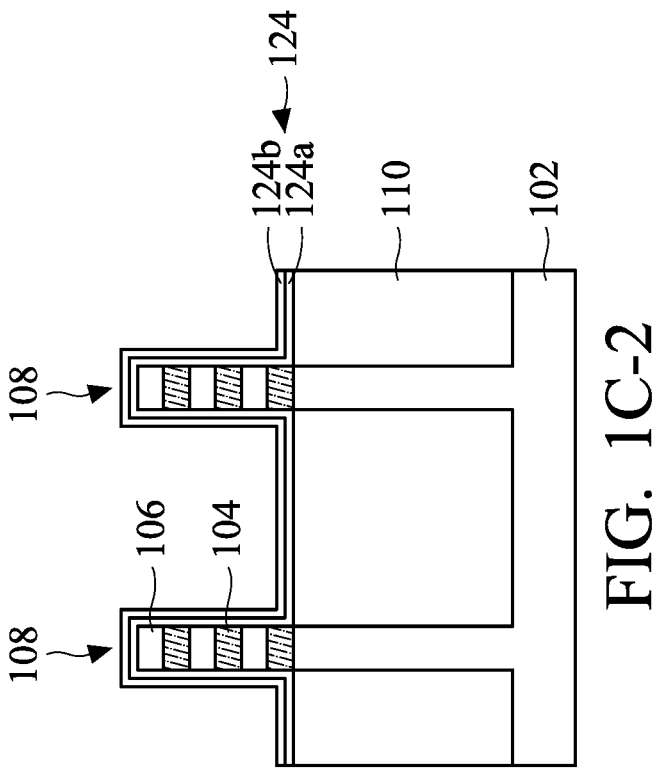

Next, the isolation structure material 110 is etched back using an etching process, and an isolation structure 110 is formed surrounding the base fin structure, as shown in FIGS. 1C, 1C-2 in accordance with some embodiments. The etching process may be used to remove the top portion of the isolation structure material 110. As a result, the first semiconductor material layers 104 and the second semiconductor material layers 106 may be exposed. The isolation structure 110 may be a shallow trench isolation (STI) structure 110. The isolation structure 110 may be configured to electrically isolate active regions such as fin structures 108 and prevent electrical interference and crosstalk.

Next, a dummy gate structure 112 is formed over and across the fin structures 108, as shown in FIGS. 1C and 1C-1 in accordance with some embodiments. The dummy gate structure 112 may be used to define the source/drain regions and the channel regions of the resulting semiconductor structure 10a. The dummy gate structure 112 may include a dummy gate dielectric layer 114, a dummy gate electrode layer 116, and hard mask layers 118. The dummy gate dielectric layer 114 and the dummy gate electrode layer 116 may be replaced by the following steps to form a real gate structure with a high-k dielectric layer and a metal gate electrode layer.

The dummy gate dielectric layer 114 may include silicon oxide. The silicon oxide may be formed by an oxidation process (e.g., a dry oxidation process, or a wet oxidation process), a chemical vapor deposition process, other applicable processes, or a combination thereof. Alternatively, the dummy gate dielectric layer 114 may include a high-k dielectric layer (e.g., the dielectric constant is greater than 3.9) such as hafnium oxide (HfO$_2$). Alternatively, the high-k dielectric layer may include other high-k dielectrics, such as LaO, AlO, ZrO, TiO, Ta$_2$O$_5$, Y$_2$O$_3$, SrTiO$_3$, BaTiO$_3$, BaZrO, HfZrO, HfLaO, HfTaO, HfSiO, HfSiON, HfTiO, LaSiO, AlSiO, (Ba, Sr) TiO$_3$, Al$_2$O$_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer 116 may include polycrystalline-silicon (poly-Si), poly-crystalline silicon-germanium (poly-SiGe), other applicable materials, or a combination thereof. The dummy gate electrode layer 116 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Next, hard mask layers 118 are formed over the dummy gate electrode layer 116, as shown in FIGS. 1C and 1C-1 in accordance with some embodiments. The hard mask layers 118 may include multiple layers, such as an oxide layer 120 and a nitride layer 122. In some embodiments, the oxide layer 120 includes silicon oxide, and the nitride layer 122 includes silicon nitride.

The formation of the dummy gate structure 112 may include conformally forming a dielectric material as the dummy gate dielectric layer 114. Afterwards, a conductive material may be formed over the dielectric material as the dummy gate electrode layer 116, and the bi-layered hard mask layers 118, including the oxide layer 120 and the nitride layer 122, may be formed over the conductive material. Next, the dielectric material and the conductive material may be patterned and etched through the bi-layered hard mask layers 118 to form the dummy gate structure 112, as shown in FIGS. 1C and 1C-1 in accordance with some embodiments. The dummy gate dielectric layer 114 and the dummy gate electrode layer 116 may be etched by a dry etching process. After the etching process, the first semiconductor material layers 104 and the second semiconductor material layers 106 may be exposed at opposite sides of the dummy gate structure 112.

Next, a conformal dielectric layer is formed over the substrate 102 and the dummy gate structure 112, and then an etching process is performed. A pair of spacer layers 124 are formed over opposite sidewalls of the dummy gate structure 112, and a source/drain opening is formed beside the dummy gate structure 112, as shown in FIGS. 1C, 1C-1, 1C-2 in accordance with some embodiments.

The spacer layers 124 may be multi-layer structures including a first spacer layer 124a and a second spacer layer 124b formed by different materials with different etching selectivity. The first spacer layer 124a and the second spacer layer 124b may be made of the different materials, depending on the process needs. In some embodiments, the first spacer layer 124a and the second spacer layer 124b are made of the same material.

The first spacer layer 124a and the second spacer layer 124b may be made of SiCN, SiOCN, SiO$_2$, Si$_3$N$_4$, Si, other dielectric materials, or a combination thereof. In some embodiments, the density of the spacer layers 124 is in a range of about 2.5 g/cm$^3$ to about 2.8 g/cm$^3$. If the density of the spacer layers 124 is too high, it may be hard to form a conformal film. In addition, the capacitance may be increased. If the density of the spacer layers 124 is too low, it may be easily etched in the following process. In some embodiments, the element ratio of Si in the spacer layers 124 is in a range of about 27 atom % to about 50 atom %. In some embodiments, the element ratio of C in the spacer layers 124 is in a range of about 4.6 atom % to about 14 atom %. In some embodiments, the element ratio of O in the spacer layers 124 is in a range of about 6 atom % to about 58 atom %. In some embodiments, the element ratio of N in the spacer layers 124 is in a range of about 1 atom % to about 44.3 atom %. The spacer layers 124 may be formed by a chemical vapor deposition (CVD) process, a spin-on-glass process, or another applicable process.

Figure 1D:
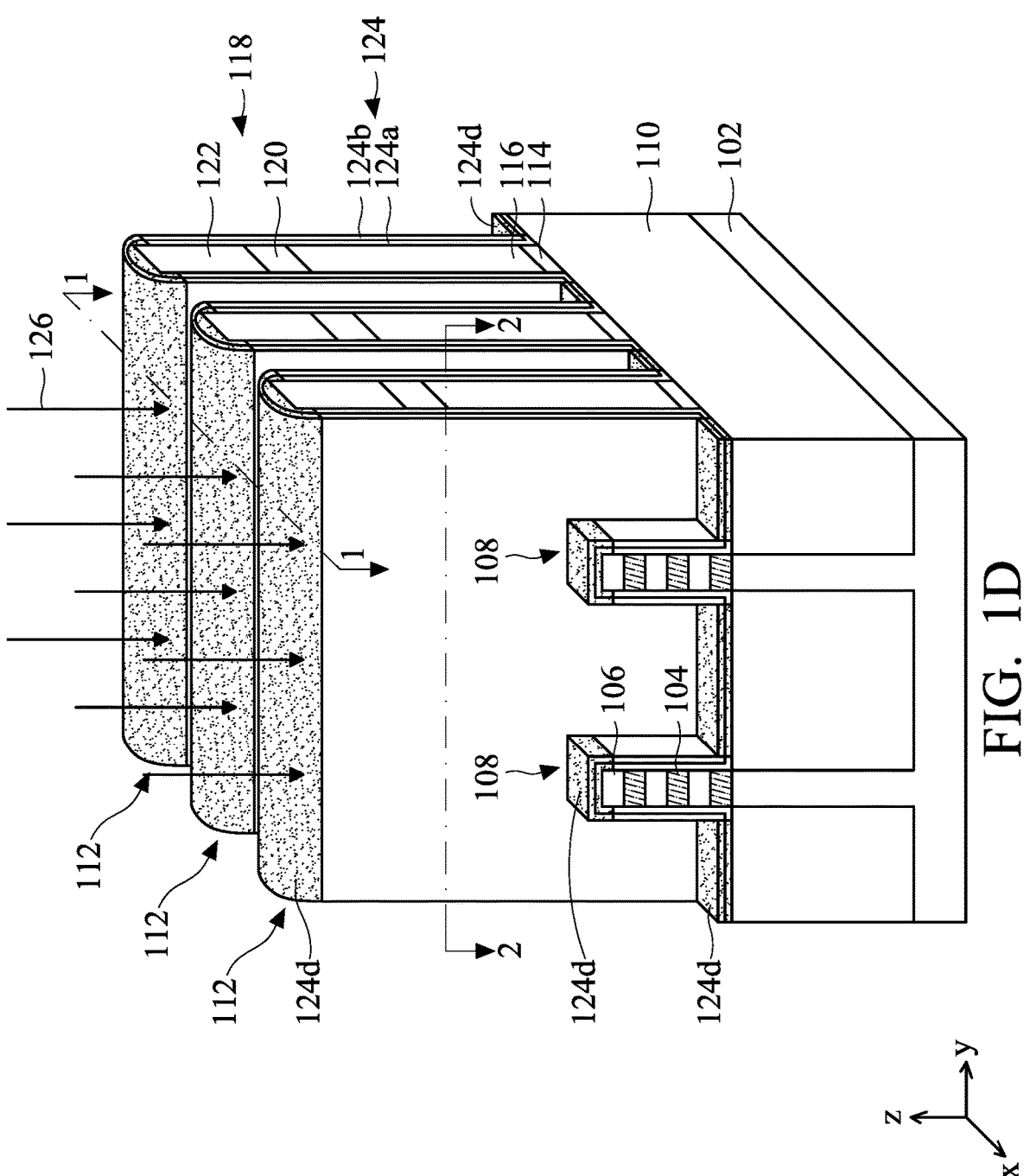
Figure 1D:
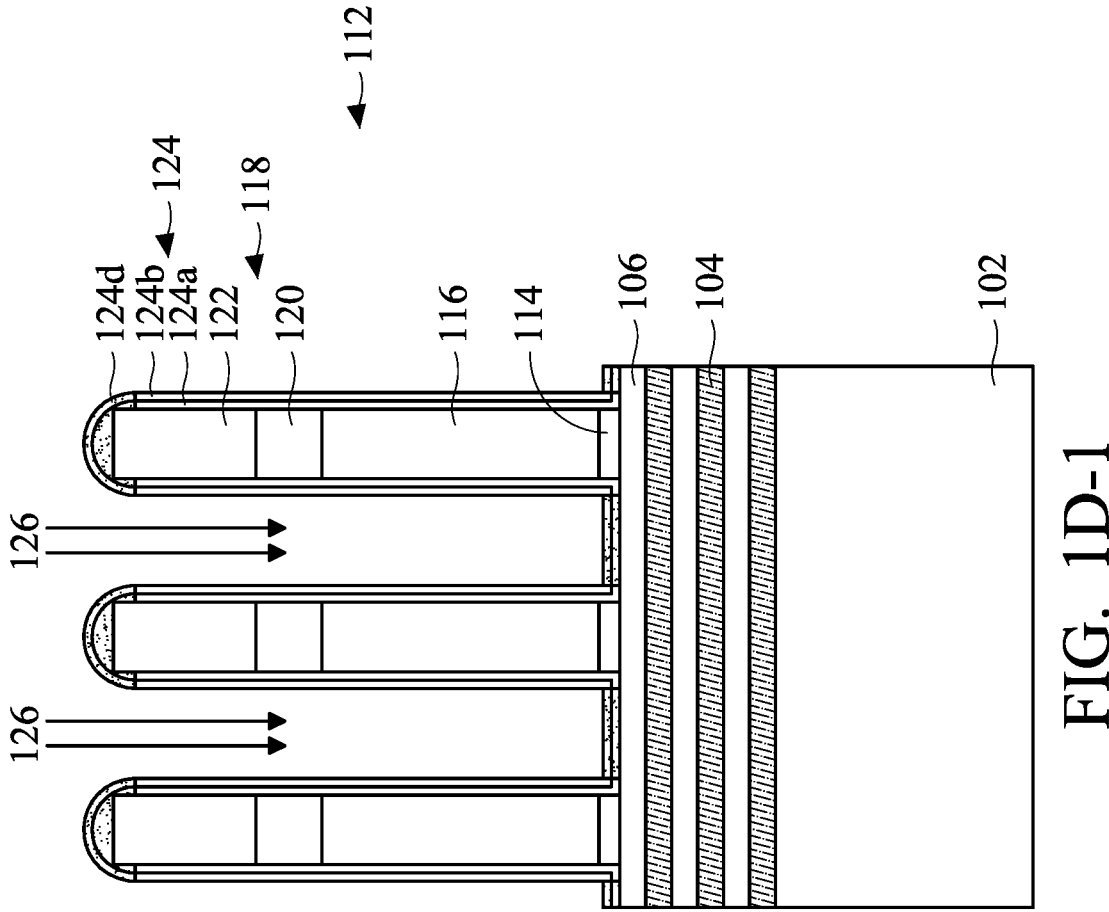
Figure 1:
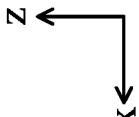
Figures 1, 1D, 2:
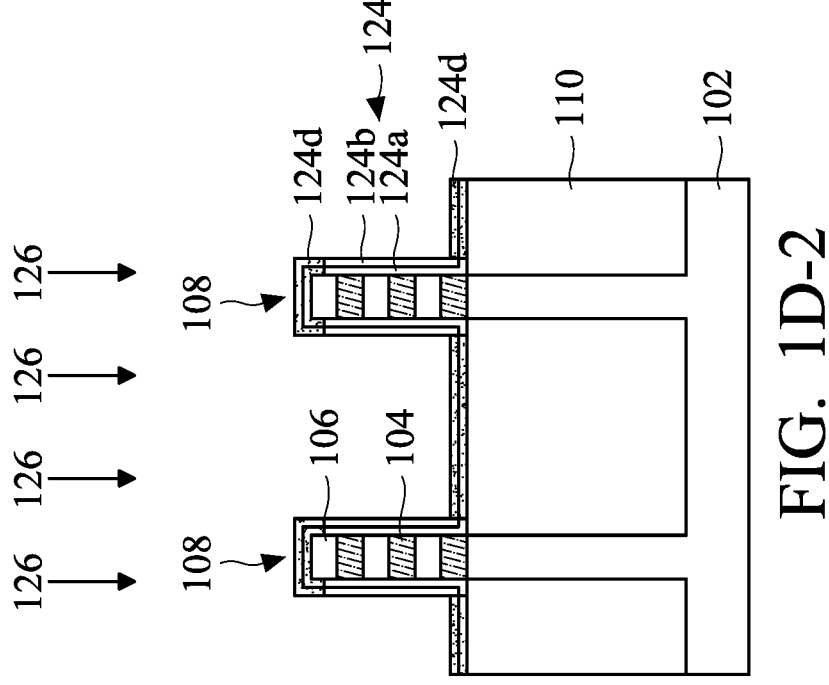

Next, an implantation process 126 is performed, and a doped region 124d of the spacer layer 124 is formed, as shown in FIGS. 1D, 1D-1, 1D-2 in accordance with some embodiments. In some embodiments, the doped region 124d of the spacer layer 124 is formed over the dummy gate structure 112 in the subsequently formed channel region of the semiconductor devices 10a. The doped region 124d of the spacer layer 124 is also formed over the fin structures 108 and the isolation structure 110 in the subsequently formed source/drain region of the semiconductor devices 10a. In some embodiments, the doped region 124d of the spacer layer 124 is in contact with the isolation structure 110.

In some embodiments, the undoped spacer layer 124 extends vertically to connect the doped region 124d overlapping the dummy gate structure 112 and the doped region 124d not overlapping the dummy gate structure 112. In some embodiments, the doped region 124d of the spacer layer 124 covers the top surfaces of the fin structure 108, and extends onto upper portions of the sidewalls of the fin structure 108.

In some embodiments, the implantation process 126 include implant dopants such as N, N$_2$, Si, Ge, In, P, C, As, other applicable dopants, or a combination thereof. The dopants may be chosen depends on the thickness of the spacer layer 124. The dose energy may be in a range of about 0.5 KeV to about 100 KeV. The dose concentration and intensity may be in a range of about 1E14 atom/cm$^3$ to about 5E16 atom/cm$^3$. The thickness of the doped region 124d of the spacer layer 124 may be determined by the dose energy and the dose concentration and intensity. If the dose energy or the dose concentration and intensity are too great, the doped region 124d of the spacer layer 124 may be too thick, and the spacer layers 124 may be consumed too much in the following etching process. If the dose energy or the dose concentration and intensity are too low, the doped region 124d of the spacer layer 124 is too thin, the spacer layers 124 may remain over the isolation structure 110 and the fin structure 108 after the following etching process.

In some embodiments, the implantation process 126 is substantially vertically performed to the top surface of the spacer layers 124. In some embodiments, the dopants are substantially perpendicularly implanted into the top surface of the spacer layer 124. In some embodiments, the tilt angle of the implantation process 126 is in a range of about 0° to about 5°. If the tilt angle is too great, the spacer layers 124 formed over the sidewall of the dummy gate structure 112 and the fin structures 108 may be implanted, and may be consumed in the following etching process.

In some embodiments, the doped region 124d of the spacer layer 124 is in contact with the top surfaces of the isolation structure 110 and the fin structure 108. In some embodiments, the doped region 124d of the spacer layer 124 covers top portions of the spacer layers 124 formed over the sidewalls of the dummy gate structures 112 and the fin structures 108. In some embodiments, the doped region 124d of the spacer layer 124 has a depth in a range of about 1 nm to about 20 nm. If the doped region 124d of the spacer layer 124 is too thin, the spacer layers 124 may remain over the isolation structure 110 and the fin structure 108 in the following etching process. If the doped region 124d of the spacer layer 124 is too thick, the spacer layers 124 may be consumed too much in the following etching process.

Figure 1E:
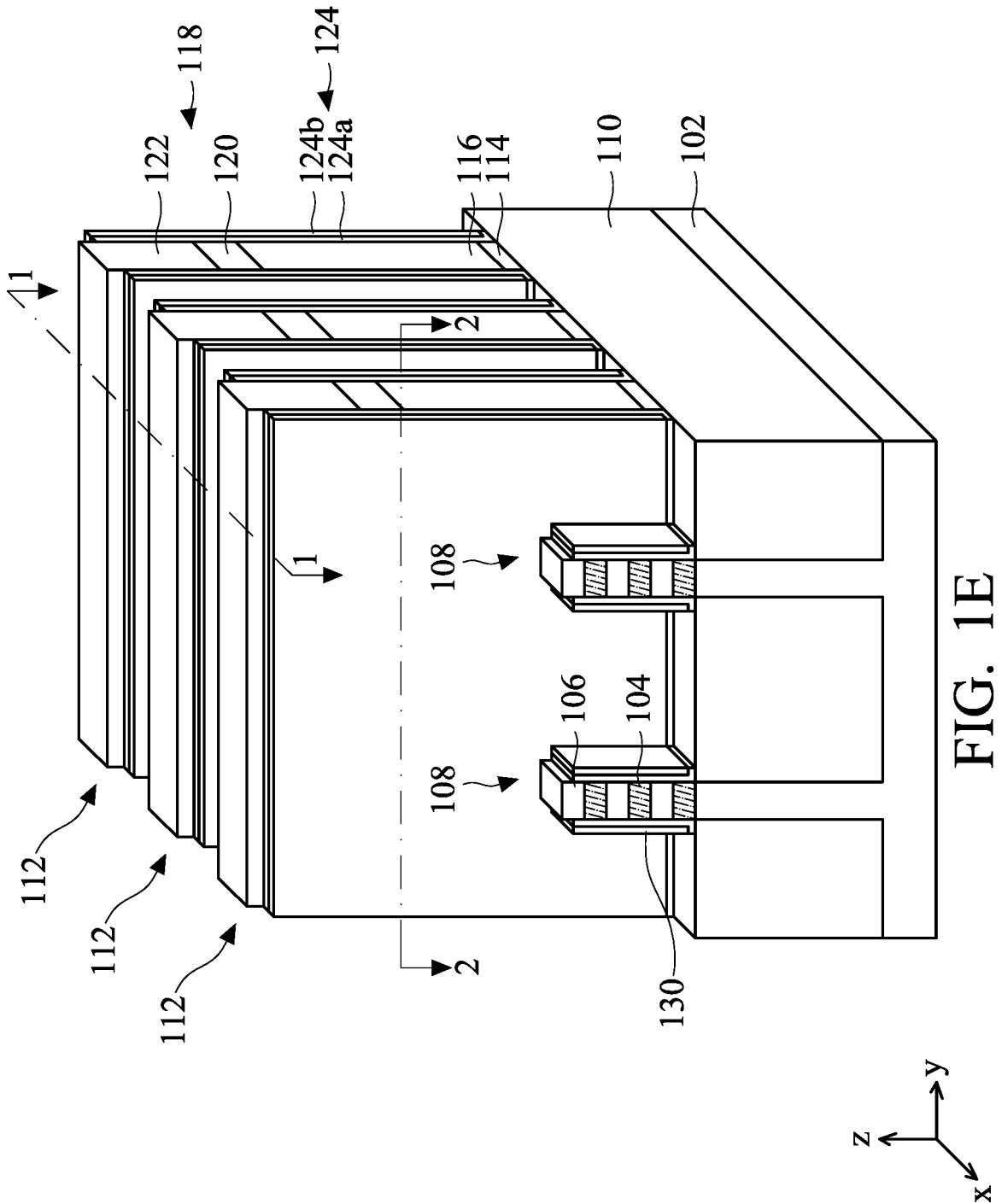
Figure 1E:
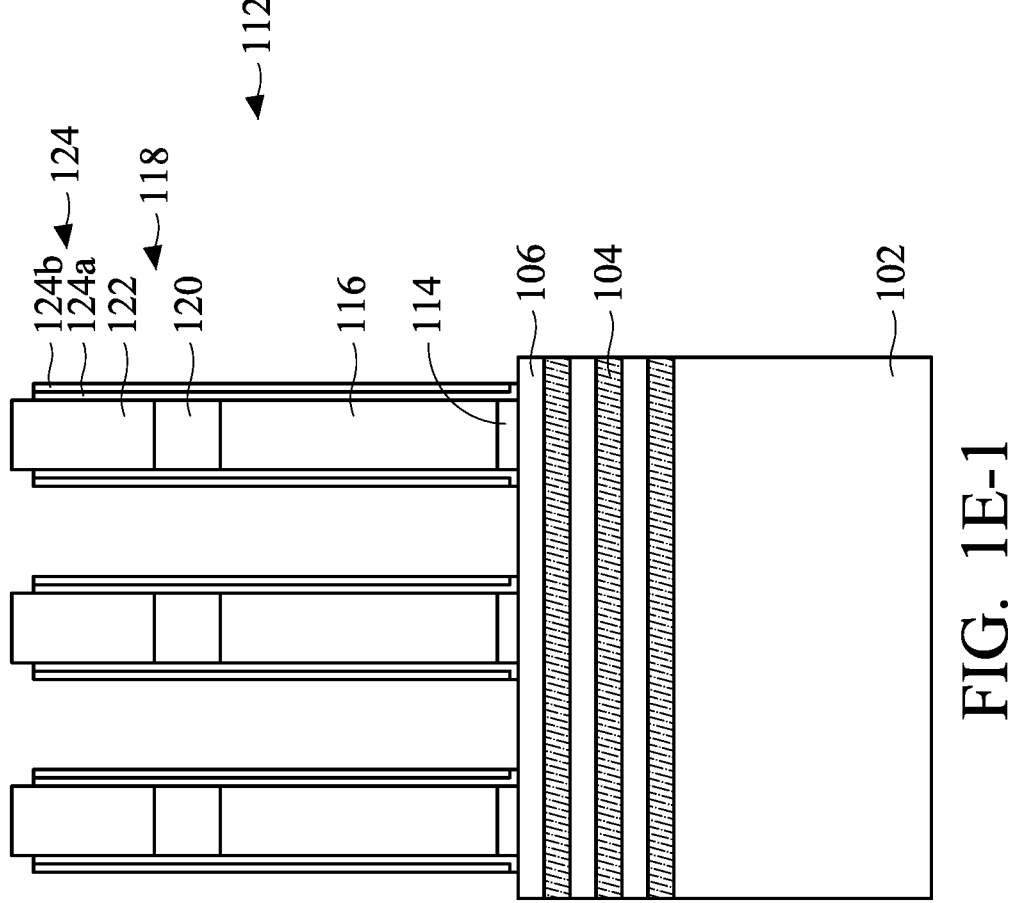
Figure 1:
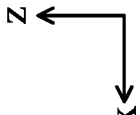
Figures 1, 1E, 2:
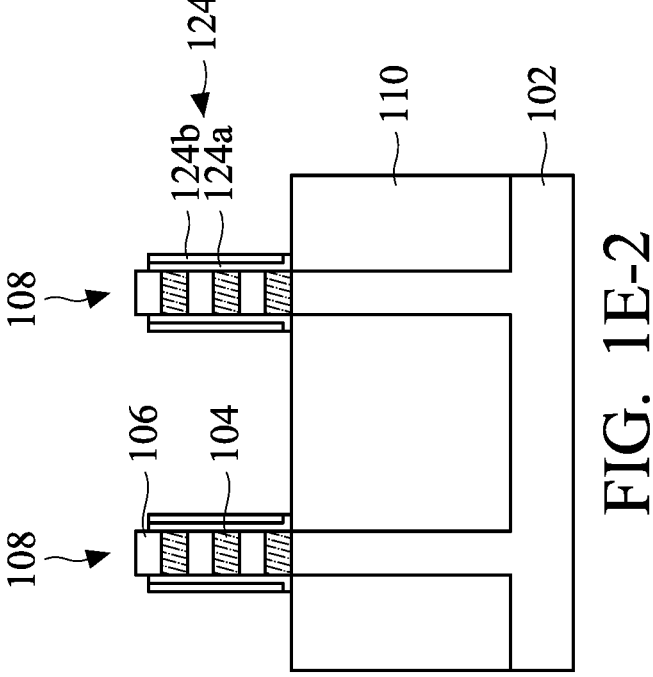

Next, the doped region 124d of the spacer layer 124 is removed, as shown in FIGS. 1E, 1E-1, 1E-2 in accordance with some embodiments. The top surfaces of the dummy gate structure 112, the fin structure 108, and the isolation structure 110 may be exposed after removing the doped region 124d of the spacer layer 124. In some embodiments, the top surfaces of the sidewalls of the dummy gate structure 112 and the fin structures 108 are exposed. In some embodiments, the exposed surfaces of the fin structures 108 and the isolation structure 110 are substantially flat. In some embodiments, gate spacers 124 are formed over the sidewalls of the dummy gate structure 112, and fin spacers 130 are formed over the sidewalls of the fin structures 108 by the remained spacer layer 124. In some embodiments, the topmost surface of the gate spacers 124 is lower than the topmost surface of the dummy gate structure 112.

In some embodiments, the doped region 124d of the spacer layer 124 is removed by a wet etching process. The wet etching process may use etchants such as H$_3$PO$_4$, dHF, other applicable etchants, or a combination thereof. In some embodiments, the temperature of the wet etching process is in a range of about 160° C. to about 165° C. In some embodiments, the flow rate of the wet etching process is in a range of about 0.5 L/min to about 0.6 L/min. In some embodiments, the concentration of the dopant such as Si used in the wet etching process is in a range of about 46 ppm to about 51 ppm. The dopant used in the implantation process 122, the wet etchant used in the wet etching process, and the material of the spacer layers 124 of may be chosen to achieve an etch rate of greater than 10 nm/minute.

Figure 1F:
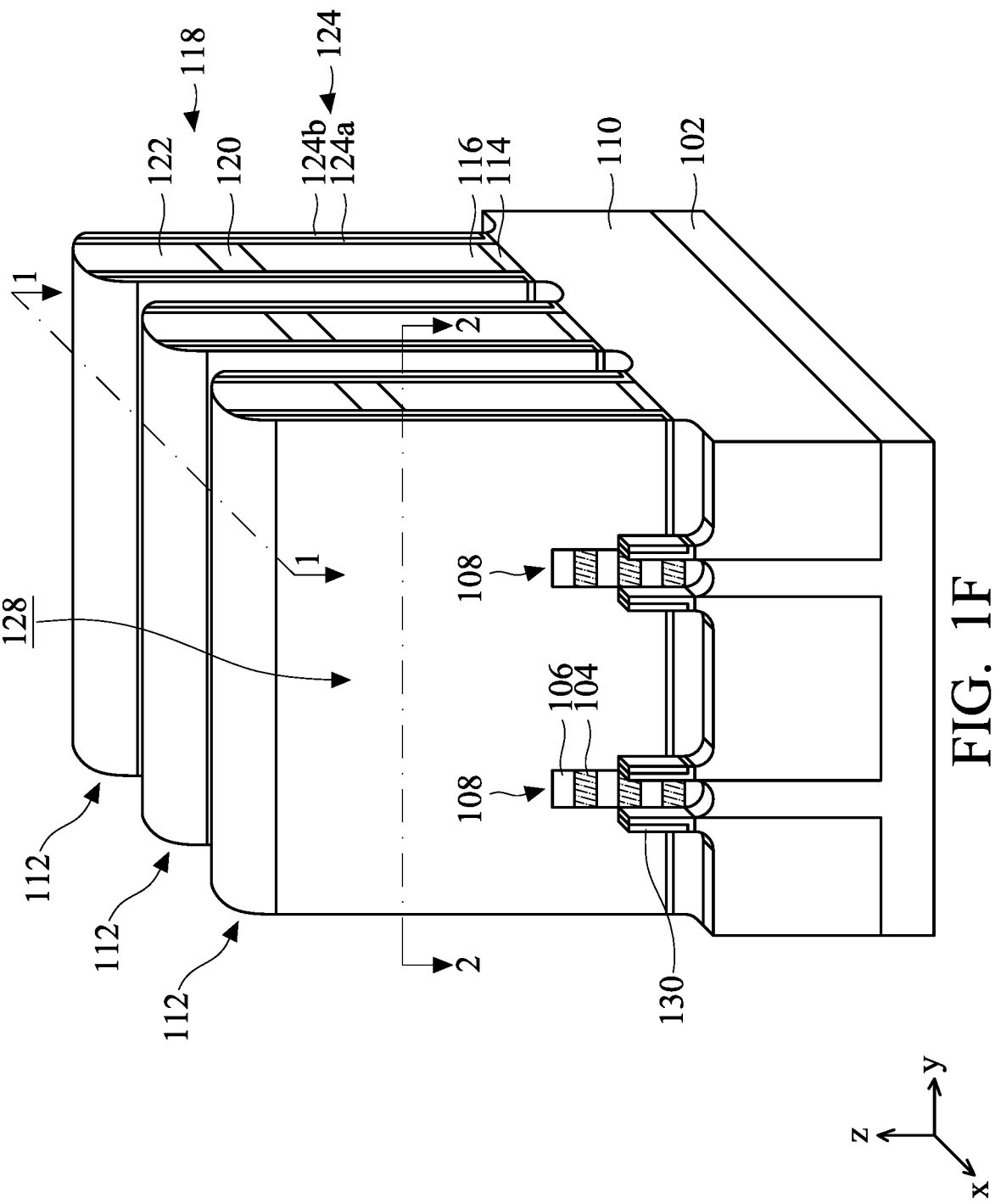
Figure 1F:
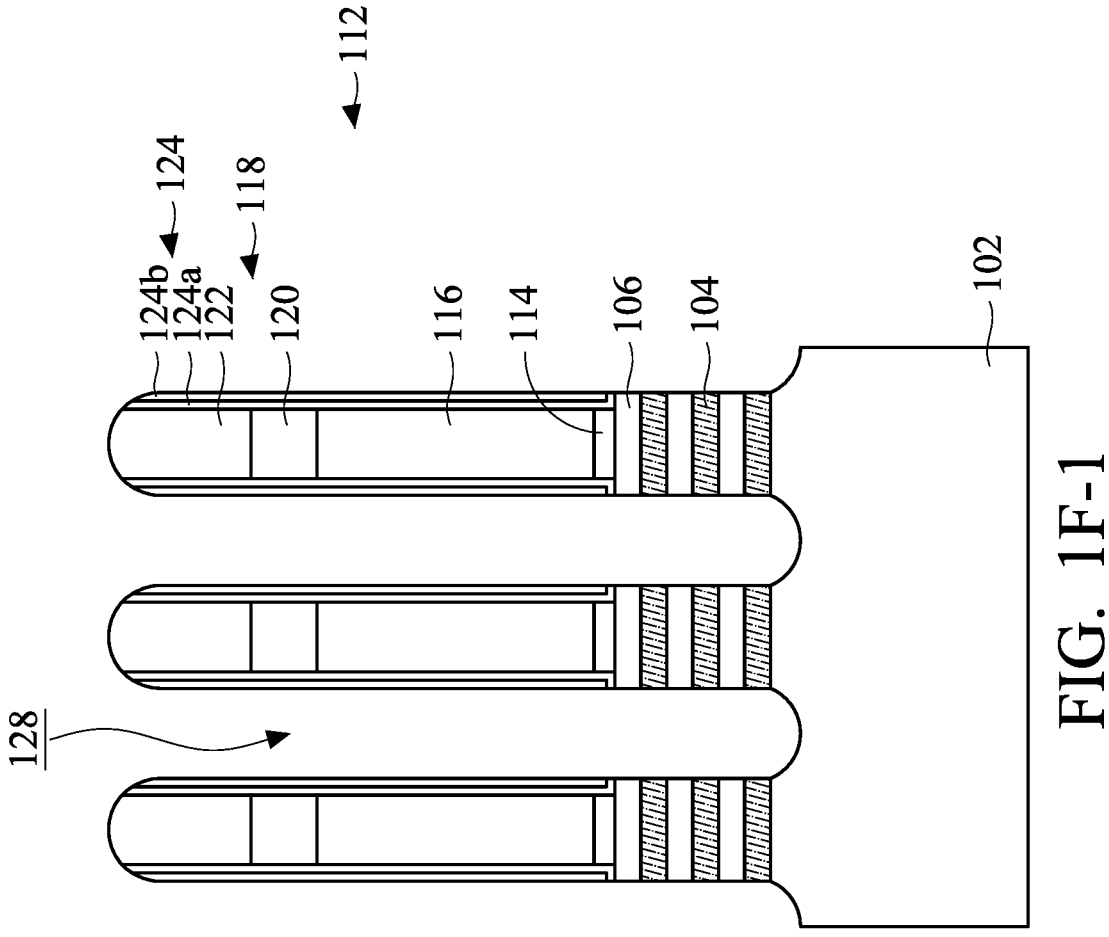
Figure 1:
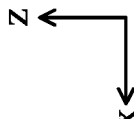
Figures 1, 1F, 2:
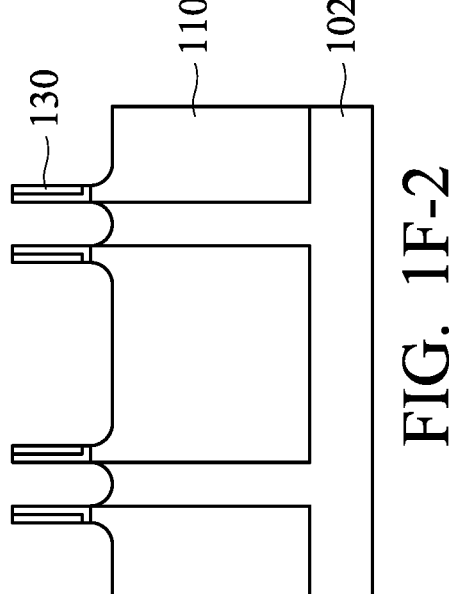

Afterwards, the first semiconductor material layers 104 and the second semiconductor material layers 106 of the fin structures 108 not covered by the dummy gate structure 112 and the spacer layers 124 are etched to form the source/drain recesses 128 beside the dummy gate structure 112, as shown in FIGS. 1F, 1F-1, 1F-2 in accordance with some embodiments.

The fin structures 108 may be recessed by performing a number of etching processes. That is, the first semiconductor material layers 104 and the second semiconductor material layers 106 of the fin structures 108 may be etched in different etching processes. The etching process may be a dry etching process or a wet etching process. In some embodiments, the fin structures 108 are etched by a dry etching process such as a bombardment process. In some embodiments, the isolation structure 110 is recessed during the etching process.

In some embodiments, the fin spacers 130 formed over the sidewalls of the fin structures 108 may also be recessed during the etching process. In some embodiments, the fin spacers 130 are formed in the source/drain recesses 128 between the dummy gate structures 112.

Next, the first semiconductor material layers 104 may be laterally etched from the source/drain recesses 128 to form recesses. The outer portions of the first semiconductor material layers 104 may be removed, and the inner portions of the first semiconductor material layers 104 under the dummy gate structure 112 and the spacer layers 124 may remain. After the lateral etching process, the sidewalls of the etched first semiconductor material layers 104 may not be aligned with the sidewalls of the second semiconductor material layers 106.

The lateral etching of the first semiconductor material layers 104 may be a dry etching process, a wet etching process, or a combination thereof. In some embodiments, the first semiconductor material layers 104 are Ge or SiGe and the second semiconductor material layers 106 are Si, and the first semiconductor material layers 104 are selectively etched to form the recesses by using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions, or the like.

Figure 1G:
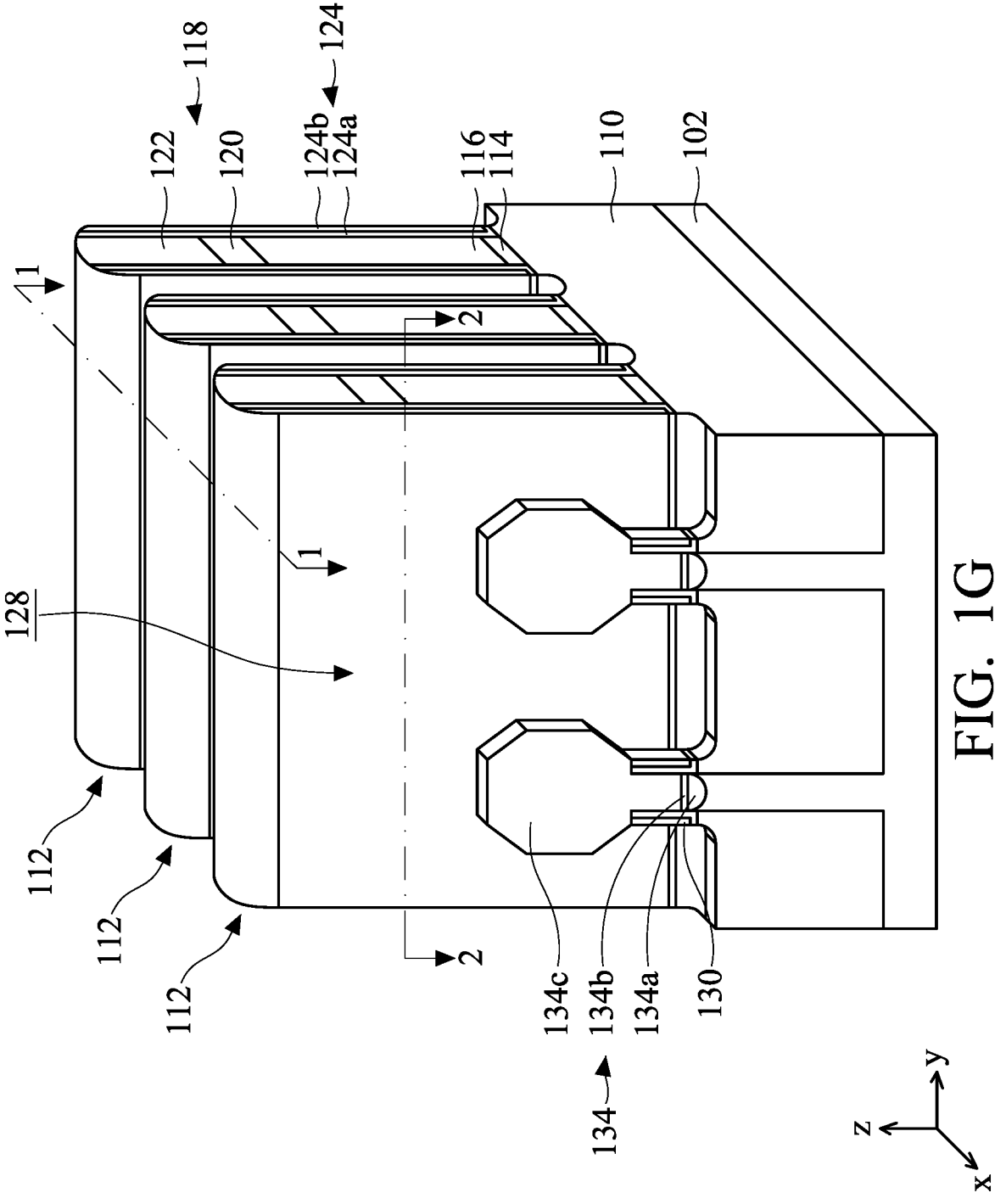
Figures 1, 1G:
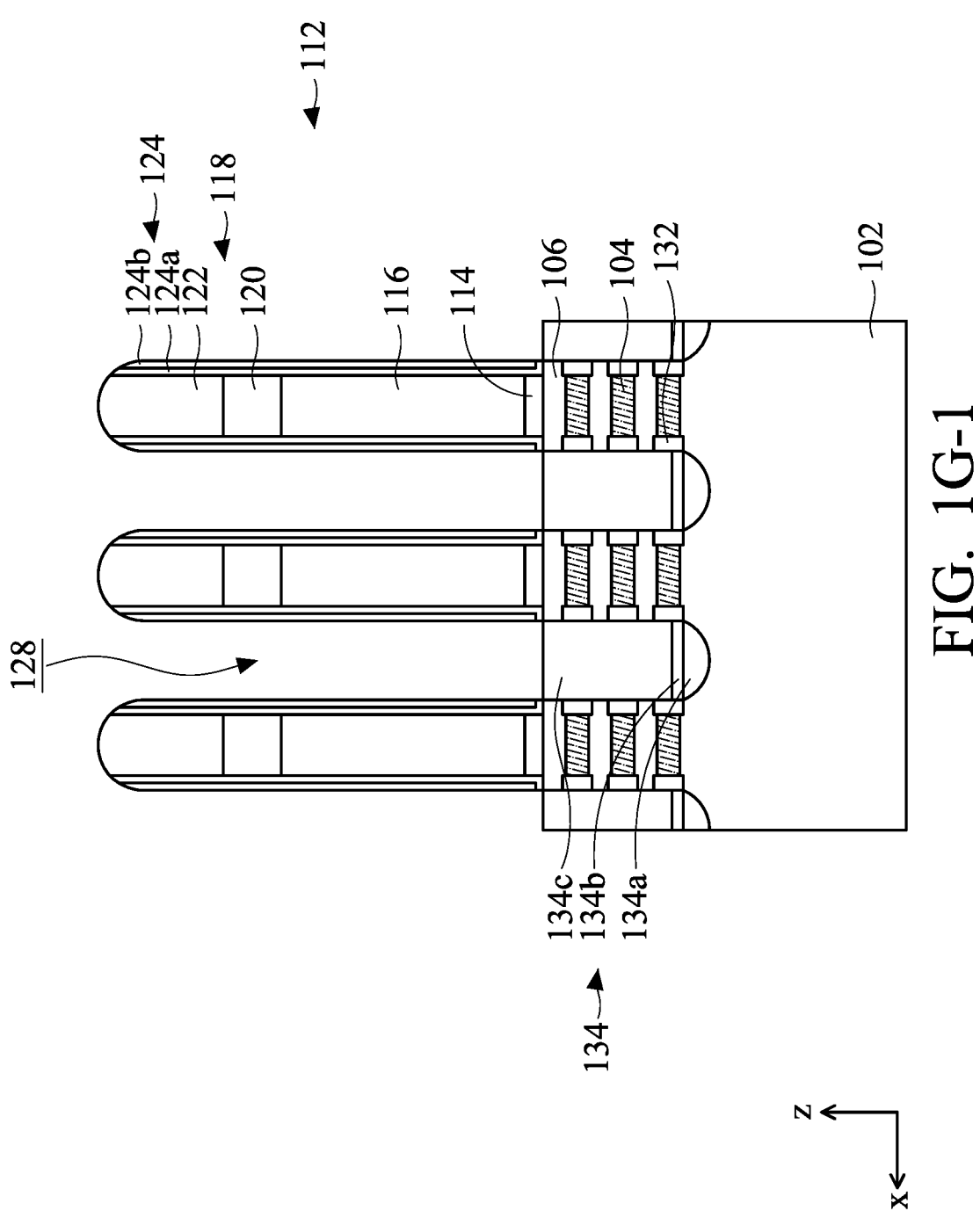
Figures 1, 1G, 2:
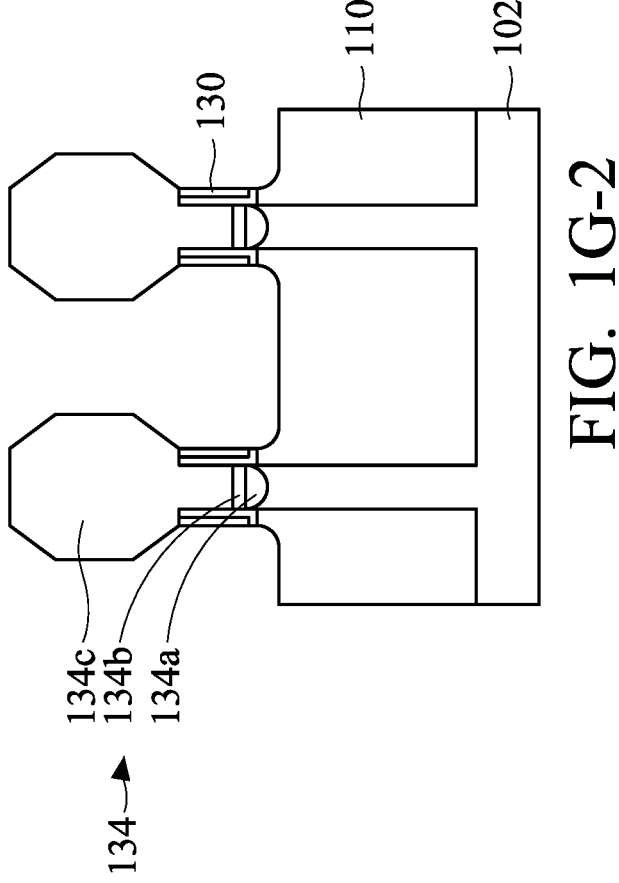

Next, an inner spacer 132 may be formed in the recess, as shown in FIG. 1G-1 in accordance with some embodiments. The inner spacer 132 may provide a barrier between subsequently formed source/drain epitaxial structures and gate structure. The inner spacer 132 may be made of dielectric material such as silicon oxide (SiO$_2$), silicon nitride (SiN), silicon carbide (SiC), silicon oxynitride (SiON), silicon carbon nitride (SiCN), silicon oxide carbonitride (SiOCN), or a combination thereof. The inner spacer 132 may be formed using a deposition process. The deposition process may include a CVD process (such as LPCVD, PECVD, SACVD, or FCVD), an ALD process, another applicable method, or a combination thereof.

Next, source/drain epitaxial structures 134 are formed in the source/drain recess 128, as shown in FIGS. 1G, 1G-1, 1G-2 in accordance with some embodiments. The source/drain epitaxial structures 134 may be formed over opposite sides of the dummy gate structure 112. Source/drain epitaxial structures 138 may refer to a source or a drain, individually or collectively dependent upon the context.

A strained material may be grown in the source/drain recess 128 using an epitaxial (epi) process to form the source/drain epitaxial structure 134. In addition, the lattice constant of the strained material may be different from the lattice constant of the substrate 102. The source/drain epitaxial structure 134 may include SiGeB, SiP, SiAs, SiGe, other applicable materials, or a combination thereof. The source/drain epitaxial structure 134 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (CI-VPE), or any other suitable method.

The source/drain epitaxial structure 134 may be in-situ doped during the epitaxial growth process. For example, the source/drain epitaxial structure 134 may be the epitaxially grown SiGe doped with boron (B). For example, the source/drain epitaxial structure 134 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. The source/drain epitaxial structure 134 may be doped in one or more implantation processes after the epitaxial growth process.

The source/drain epitaxial structure 134 may include a first portion 134a formed at the bottom of the source/drain recess 128, a second portion 134b formed over the first portion 134a, and a third portion 134c filled over the second portion 134b in the source/drain recess 128.

The first portion 134a may be made of dielectric material such as silicon nitride, silicon oxide, silicon oxynitride (SiON), other applicable materials, or a combination thereof. The first portion 134a also may be made of un-doped or lower doped Si, SiGe, or SiP. The second portion 134b may be a dielectric layer such as a SiN layer. The second portion 134b may be optional. The second portion 134b may prevent leakage from the source/drain epitaxial structures 134. The second portion 134b may also be formed over the fin spacers 130 and the isolation structure 110, and may be consumed in the subsequent etching processes. The third portion 134c may be doped SiGe or SiP. In some embodiments, the dopant concentration of the third portion 134c is higher than the dopant concentration of the first portion 134a. Therefore, dopant out-diffusing issue may be prevented.

The shape of the source/drain epitaxial structure 134 may be determined by the height of the fin spacer 130. Since the fin spacer 130 is formed after the implantation process 126 and the wet etching process, the fin spacer 130 may be higher. Therefore, adjacent source/drain epitaxial structure 134 may not be merged. The adjacent source/drain epitaxial structure 134 may be separated from each other. The capacitance may be reduced. In addition, the capacitance may be decreased. Higher fin spacer 130 may also remain after the following etching processes.

Figure 1H:
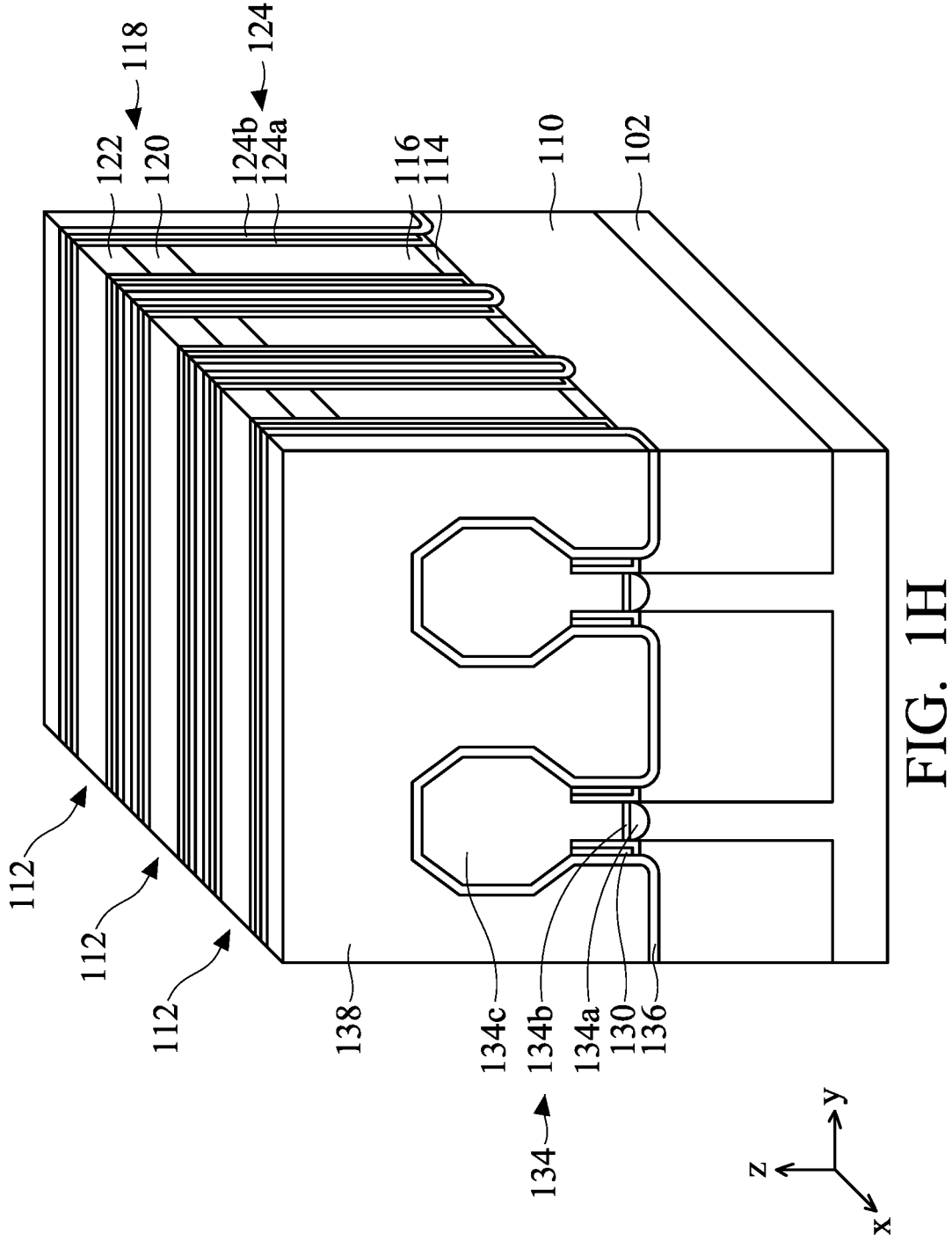

Next, a contact etch stop layer 136 may be formed over the source/drain epitaxial structure 134, as shown in FIG. 1H in accordance with some embodiments. More specifically, the contact etch stop layer 136 may cover the sidewalls of the spacer layers 124 and the source/drain epitaxial structure 134. The contact etch stop layer 136 may be made of a dielectric material such as silicon nitride, silicon oxide, silicon oxynitride (SiON), other applicable materials, or a combination thereof. The contact etch stop layer 136 may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

After the contact etch stop layer 136 is formed, an inter-layer dielectric (ILD) structure 138 is formed over the source/drain epitaxial structure 134, as shown in FIG. 1H in accordance with some embodiments. The ILD structure 138 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or another applicable dielectric material. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 138 may be formed by chemical vapor deposition (CVD), physical vapor deposition (PVD), atomic layer deposition (ALD), spin-on coating, or another applicable process.

Afterwards, a planarizing process or an etch-back process may be performed on the ILD structure 138 until the top surface of the dummy gate structure 112 is exposed. After the planarizing process, the top surface of the dummy gate structure 112 may be substantially level with the top surfaces of the spacer layers 124 and the ILD structure 138. The planarizing process may include a grinding process, a chemical mechanical polishing (CMP) process, an etching process, other applicable processes, or a combination thereof.

Next, the dummy gate structure 112 is removed, and a trench is formed between the spacer layers 124 over the fin structures 108. The dummy gate structure 112 may be removed by a dry etching process or a wet etching process.

The removal process may include one or more etching processes. For example, when the dummy gate electrode layer 116 is polysilicon, a wet etchant such as a tetramethylammonium hydroxide (TMAH) solution may be used to selectively remove the dummy gate electrode layer 116. Afterwards, the dummy gate dielectric layer 114 may be removed using a plasma dry etching, a dry chemical etching, and/or a wet etching.

Next, the first semiconductor material layers 104 are removed and gaps are formed between the first semiconductor material layers 104 (not shown). More specifically, the second semiconductor material layers 106 exposed by the gaps form nanostructures 106, and the nanostructures 106 are configured to function as channel regions 106 in the resulting semiconductor devices 10a in accordance with some embodiments.

The first semiconductor material layers 104 may be removed by performing one or more etching processes. The etching process may include a selective wet etching process, such as APM (e.g., ammonia hydroxide-hydrogen peroxide-water mixture) etching process. The wet etching process uses etchants such as ammonium hydroxide ($NH_4OH$), TMAH, ethylenediamine pyrocatechol (EDP), and/or potassium hydroxide (KOH) solutions.

Figure 1I:
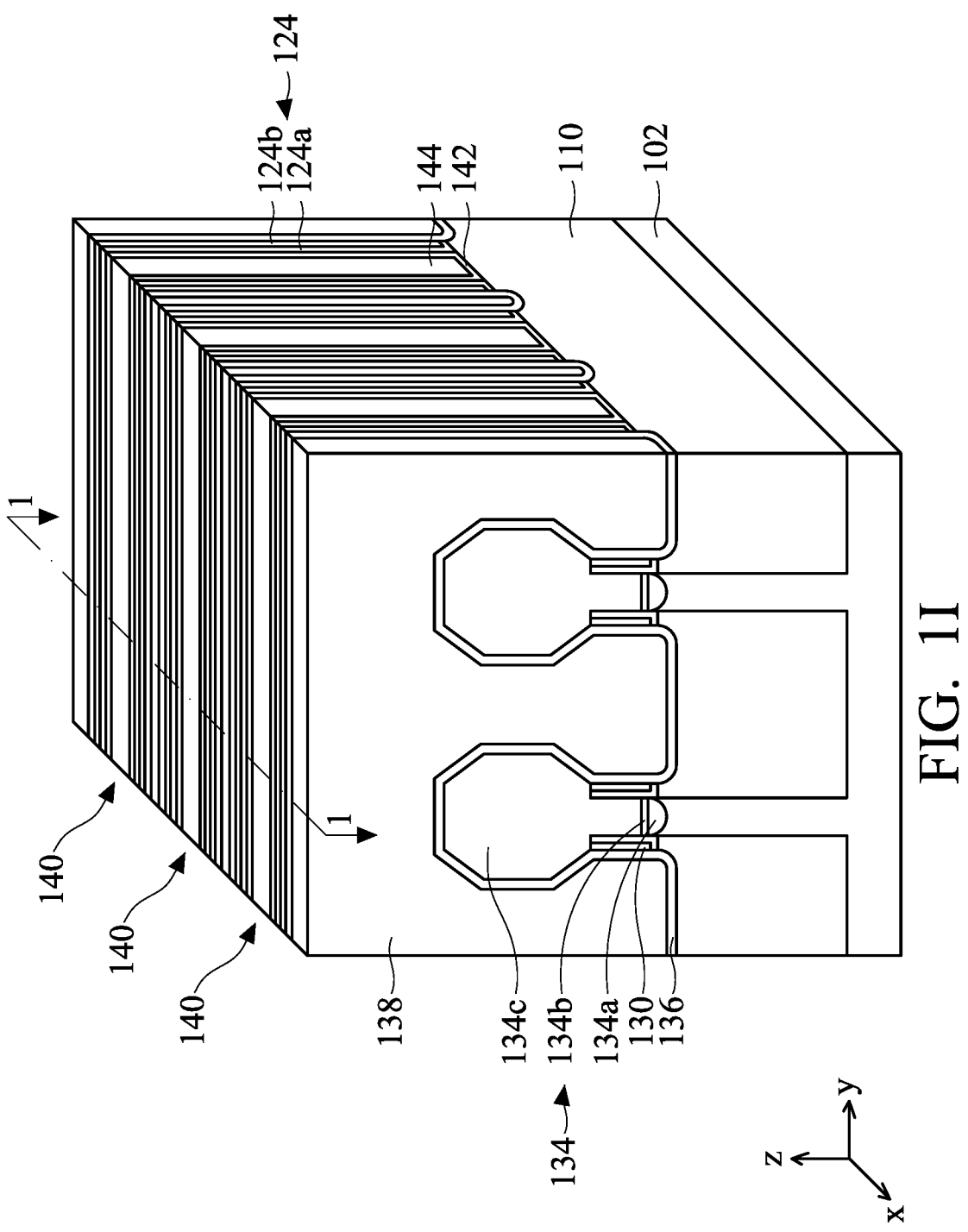
Figures 1, 1I:
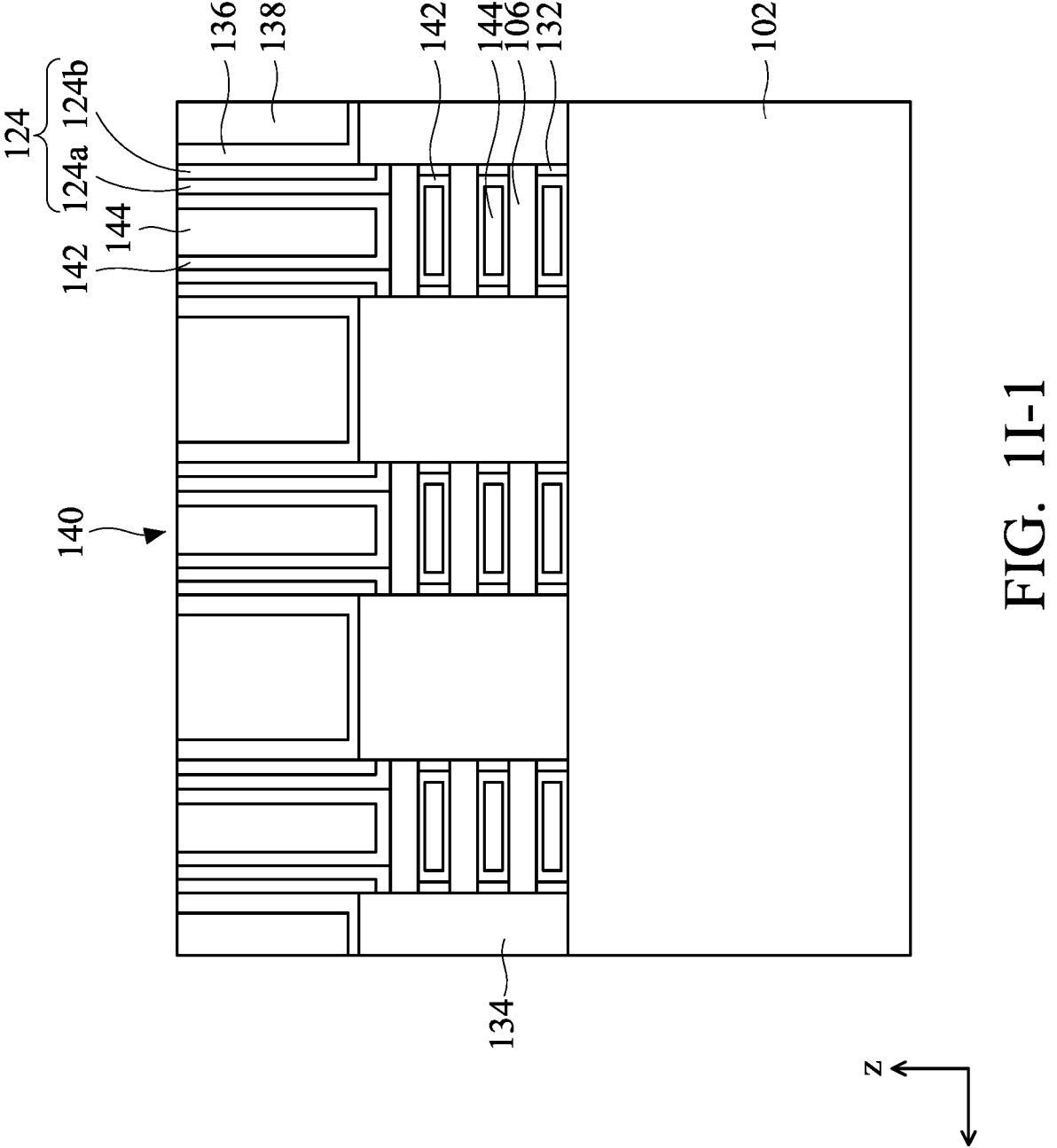

Next, gate structures 140 are formed surrounding the nanostructures 106 and over the nanostructures 106, as shown in FIGS. 1I and 1I-1 in accordance with some embodiments. Gate structures 140 are formed surrounding the nanostructures 106 to form gate-all-around (GAA) transistor structures. Therefore, the gate control ability may be enhanced.

In some embodiments as shown in FIGS. 1I and 1I-1, the gate structures 140 are multi-layered structures. Each of the gate structures 140 may include an interfacial layer, a gate dielectric layer 142, a work function layer 144, and a gate electrode layer.

The interfacial layer may be formed around the nanostructures 106 and on the exposed portions of the base fin structures. The interfacial layer may be made of silicon oxide, and the interfacial layer may be formed by thermal oxidation.

The gate dielectric layer 142 is formed over the interfacial layer, so that the nanostructures 106 are surrounded (e.g. wrapped) by the gate dielectric layer 142, as shown in FIGS. 1I and 1I-1 in accordance with some embodiments. In addition, the gate dielectric layer 142 also covers the sidewalls of the spacer layers 124 and the inner spacers 132 in accordance with some embodiments. The gate dielectric layer 142 may be made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other applicable high-k dielectric materials, or a combination thereof. The gate dielectric layer 142 may be formed using CVD, ALD, other applicable methods, or a combination thereof.

Next, the work function layer 144 is conformally formed over the gate dielectric layer 142, as shown in FIGS. 1I and 1I-1 in accordance with some embodiments. The work function layer 144 may be made of a metal material. The metal material of the work function layer 144 may include an N-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. The work function layer 144 may be formed by using CVD, ALD, other applicable methods, or a combination thereof.

The metal material of the work function layer 144 may include a P-work-function metal. The P-work-function metal may include titanium nitride (TiN), tungsten nitride (WN), tantalum nitride (TaN), ruthenium (Ru) or a combination thereof. The work function layer 144 may be formed by using CVD, ALD, other applicable methods, or a combination thereof.

Next, a gate electrode layer may be formed over the work function layer 144. The gate electrode layer may be made of one or more layers of conductive material, such as aluminum, copper, titanium, tantalum, tungsten, cobalt, molybdenum, tantalum nitride, nickel silicide, cobalt silicide, TIN, WN, TiAl, TiAlN, TaCN, TaC, TaSiN, metal alloys, another suitable material, or a combination thereof. The gate electrode layer may be formed using CVD, ALD, electroplating, another applicable method, or a combination thereof. After the gate electrode layer is formed, a planarization process such as CMP or an etch-back process may be performed.

Figure 1J:
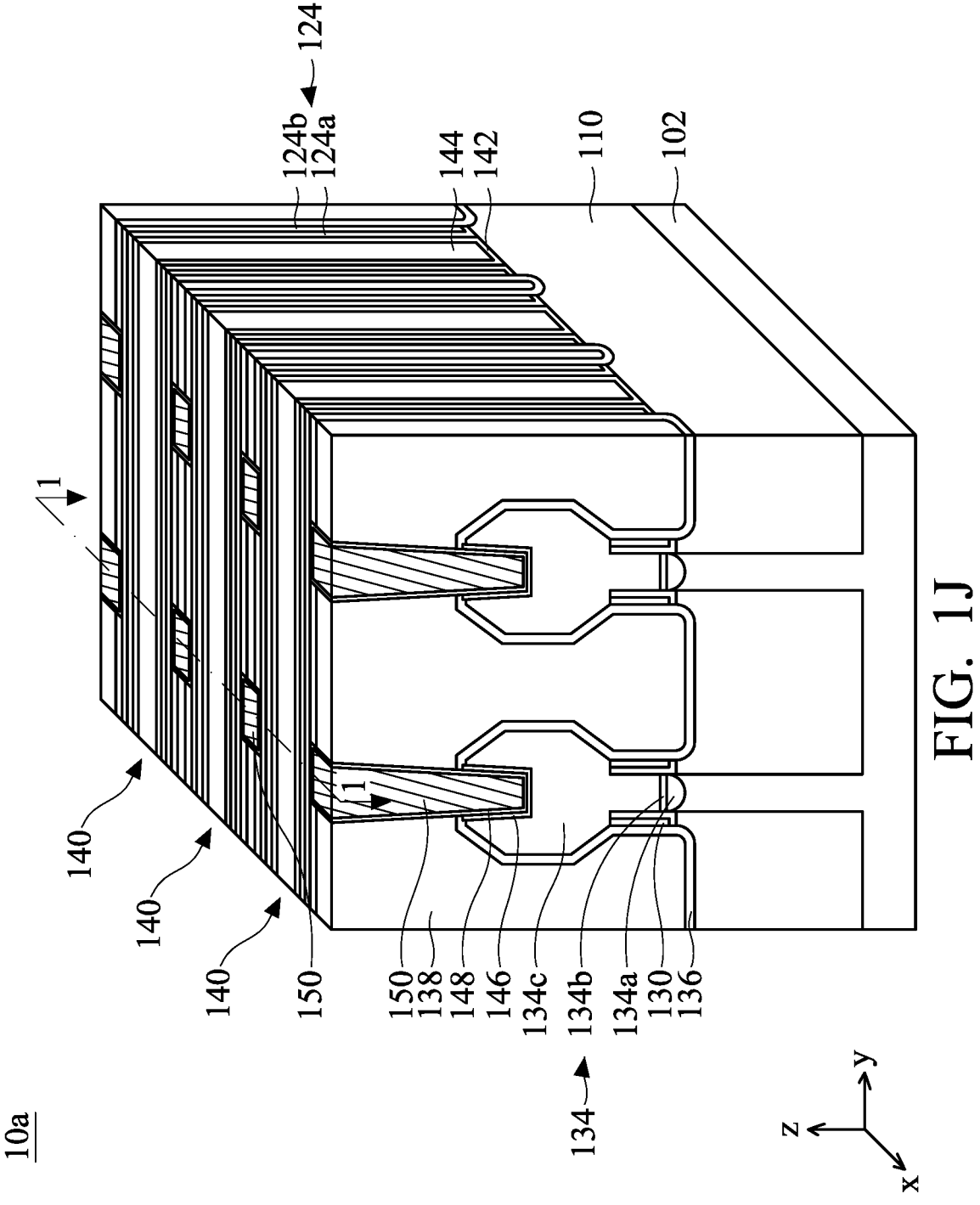
Figures 1, 1J:
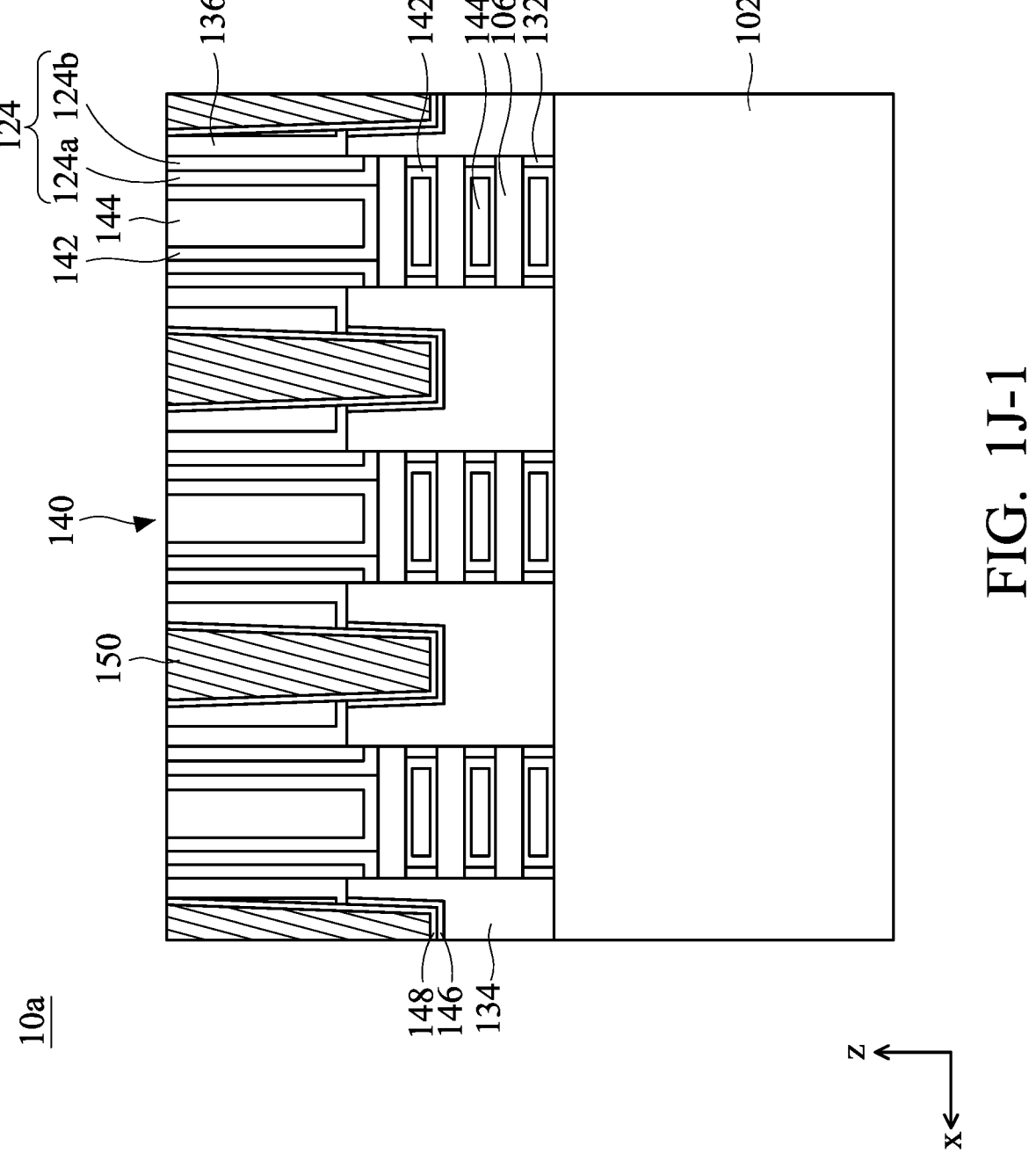

Next, a metal semiconductor compound layer 146 may be formed over the source/drain epitaxial structure 134, as shown in FIGS. 1J and 1J-1 in accordance with some embodiments. The metal semiconductor compound layer 146 may reduce the contact resistance between the source/drain epitaxial structure 134 and the subsequently formed contact structure over the source/drain epitaxial structure 134. The metal semiconductor compound layer 146 may be made of titanium silicide ($TiSi_2$), nickel silicide (NiSi), cobalt silicide (CoSi), or other suitable low-resistance materials. The metal semiconductor compound layer 146 may be formed over the source/drain epitaxial structure 134 by forming a metal layer over the source/drain epitaxial structure 134 first. The metal layer may react with the source/drain epitaxial structure 134 in an annealing process and a metal semiconductor compound layer 146 may be produced. Afterwards, the unreacted metal layer may be removed in an etching process and the metal semiconductor compound layer 146 may be left.

Next, a barrier layer 148 may be conformally formed over the bottom surface and the sidewalls of the source/drain recess 128, as shown in FIGS. 1J and 1J-1 in accordance with some embodiments. Afterwards, the barrier layer 148 may be etched back. The barrier layer 148 remains over the bottom surface of the source/drain recess 128. The barrier layer 148 may be formed before filling the conductive material in the source/drain recess 128 to prevent the conductive material from diffusing out. The barrier layer 148 may also serve as an adhesive or glue layer. The material of the barrier layer 148 may be TiN, Ti, other applicable materials, or a combination thereof. The barrier layer 148 may be formed by depositing the barrier layer 148 materials by a physical vapor deposition process (PVD) (e.g., evaporation or sputtering), an atomic layer deposition process (ALD), an electroplating process, other applicable processes, or a combination thereof.

Afterwards, a contact structure 150 is formed into the source/drain recess 128 over the source/drain epitaxial structure 134, as shown in FIGS. 1J and 1J-1 in accordance with some embodiments. The contact structure 150 may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The contact structure 150 may be formed by a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the contact structure 150, and then a planarization process such as a chemical mechanical polishing (CMP) process or an etch back process is optionally performed to remove excess conductive materials. After the planarization process, the top surface of the contact structure 150 may be level with the top surface of gate structure 140 and the spacer layers 124.

By forming the source/drain recesses 128 with an implantation process and a wet etching process, the spacer layer 124 may be less consumed, and the fin spacers 130 may be higher. Therefore, adjacent source/drain epitaxial structures 134 may not be merged, and the capacitance may be decreased.

Many variations and/or modifications may be made to the embodiments of the disclosure. FIGS. 2A, 2B, 2C, 2D, 2E are cross-sectional representations of various stages of forming a semiconductor device structure 10b, in accordance with some embodiments of the disclosure. FIGS. 2A-1, 2B-1, 2C-1, 2D-1, 2E-1 are cross-sectional representations of various stages of forming a semiconductor device structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIGS. 2C and 2C-1 in accordance with some embodiments, the implantation process 126 is performed on the inner spacer layer 132.

Figure 2A:
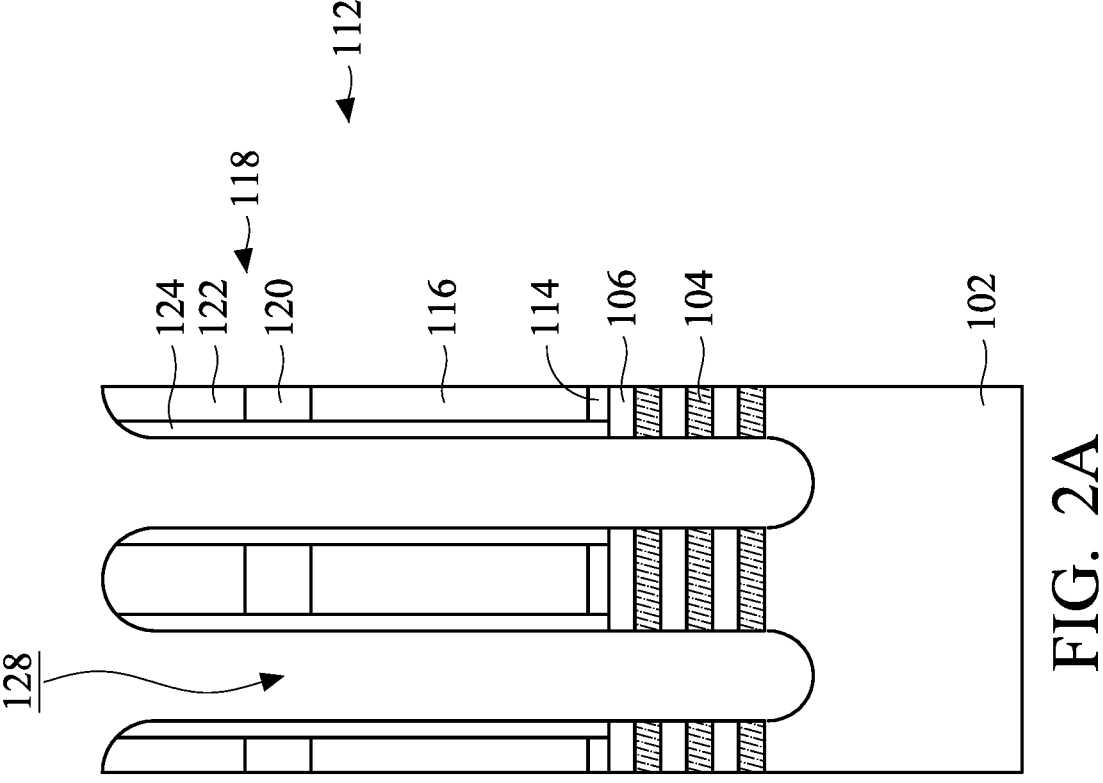
FIGS. 2A, 2B, 2C, 2D, 2E are cross-sectional represen-tations of various stages of forming a semiconductor device structure, in accordance with some embodiments of the disclosure.
Figure 2A:
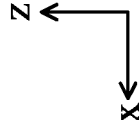
Figures 1, 2A:
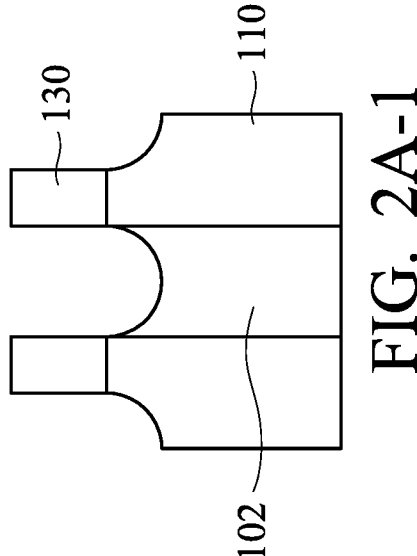

The source/drain recesses 128 may be formed by plasma etching steps, as shown in FIGS. 2A and 2A-1 in accordance with some embodiments. In some embodiments, the spacer layer 124 is a single layer structure. In some embodiments, the spacer layer 124 may be formed by a SiOCN. In some embodiments, the top surfaces of the isolation structure 110 are recessed after forming the source/drain recesses 128.

Figure 2B:
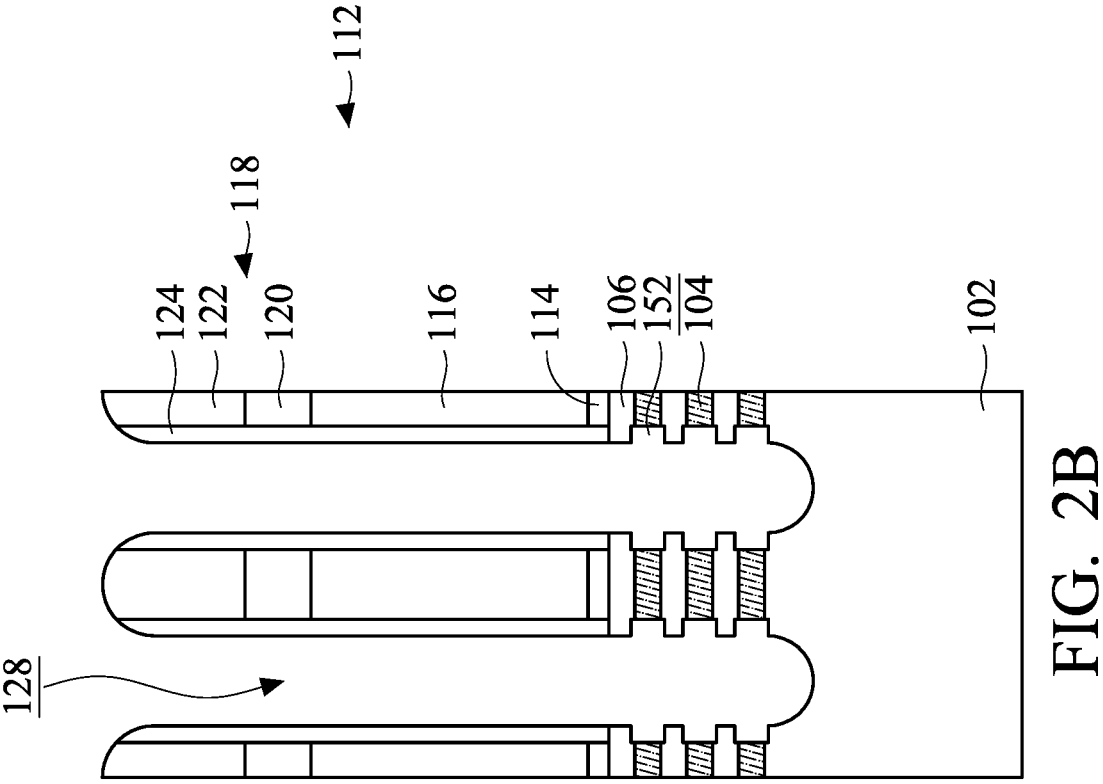
Figure 2B:
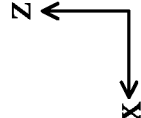
Figures 1, 2B:
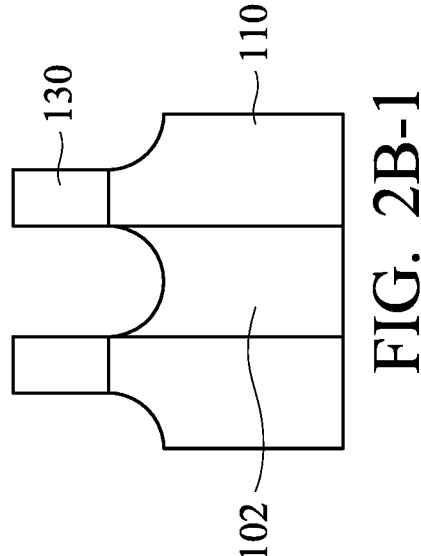

Next, the first semiconductor material layers 104 is laterally recessed, and recesses 152 are formed in the first semiconductor material layers 104, as shown in FIGS. 2B and 2B-1 in accordance with some embodiments. The processes and materials for forming recesses 152 may be the same as, or similar to, those used to form the recesses in the previous embodiments. For the purpose of brevity, the descriptions of these processes are not repeated herein.

Figure 2C:
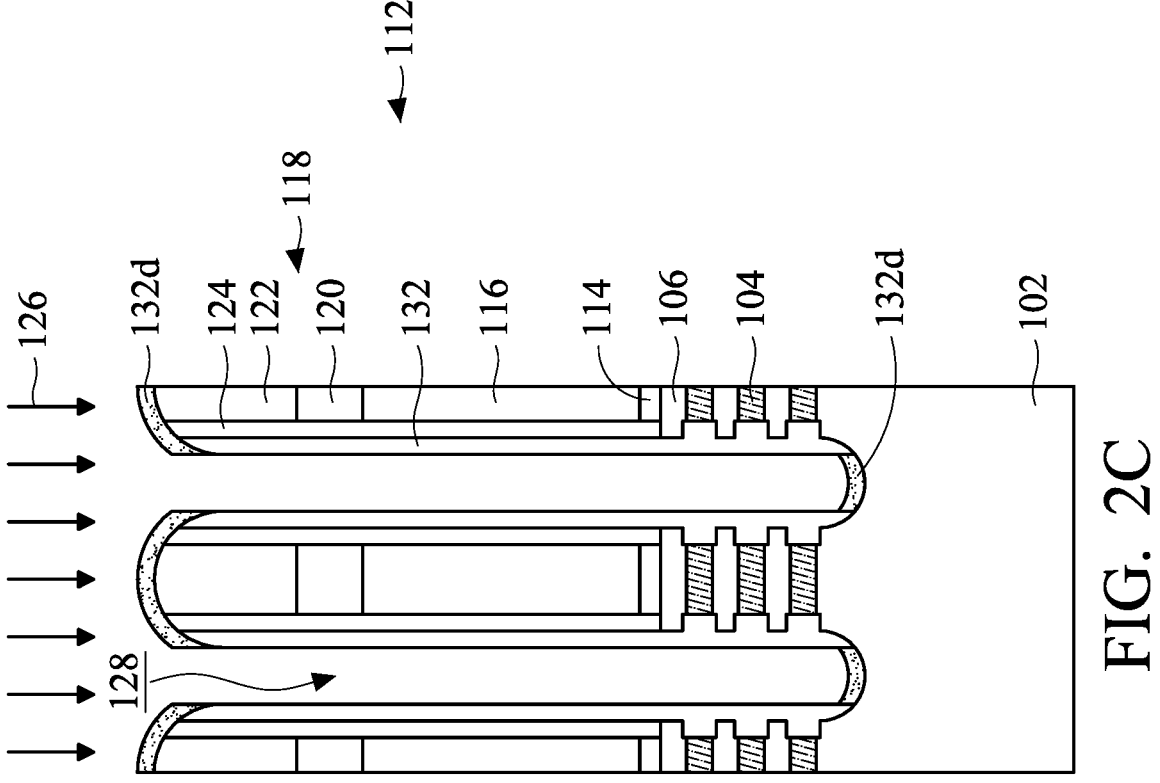
Figures 1, 2C:
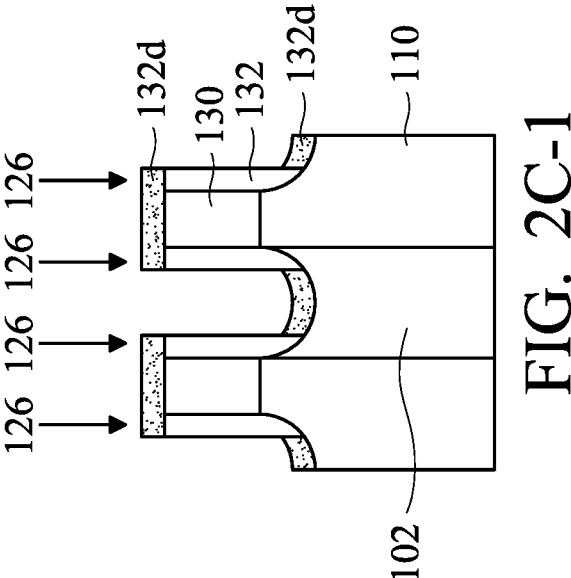

Later, an inner spacer layer 132 is conformally formed over the dummy gate structure 112, the fin spacer 130, and in the source/drain recesses 128, as shown in FIGS. 2C and 2C-1 in accordance with some embodiments. The inner spacer layer 132 may cover the sidewalls of the spacer layer 124 and the sidewalls of the second semiconductor material layers 106. The inner spacer layer 132 may also cover the top surface of the isolation structure 110 and the top surface of the substrate 102. The inner spacer layer 132 may also cover the top surface and the sidewalls of the fin spacer 130. The inner spacer layer 132 may be of SiOC, SiOCN, SiCN, other dielectric materials, or a combination thereof. In some embodiments, the element ratio of Si in the inner spacer layer 132 is in a range of about 27 atom % to about 37 atom %. In some embodiments, the element ratio of C in the inner spacer layer 132 is in a range of about 6 atom % to about 14 atom %. In some embodiments, the element ratio of O in the inner spacer layer 132 is in a range of about 12 atom % to about 58 atom %. In some embodiments, the element ratio of N in the inner spacer layer 132 is in a range of about 1 atom % to about 44 atom %.

Next, an implantation process 126 is performed, and a doped region 132d of the inner spacer layer 132 is formed in the inner spacer layer 132 over the dummy gate structure 112 and at the bottom of the source/drain recesses 128, as shown in FIGS. 2C and 2C-1 in accordance with some embodiments. In addition, the doped region 132d of the inner spacer layer 132 is formed over the fin spacer 130 and over the substrate 102 between the fin spacers 130. In some embodiments, the doped region 132d of the inner spacer layer 132 is in contact with the substrate 102.

The doped region 132d of the inner spacer layer 132 may be formed over the isolation structure 110. The processes and materials for the implantation process 126 may be the same as, or similar to, those used for the implantation process in the previous embodiments. For the purpose of brevity, the descriptions of these processes are not repeated herein.

Figure 2D:
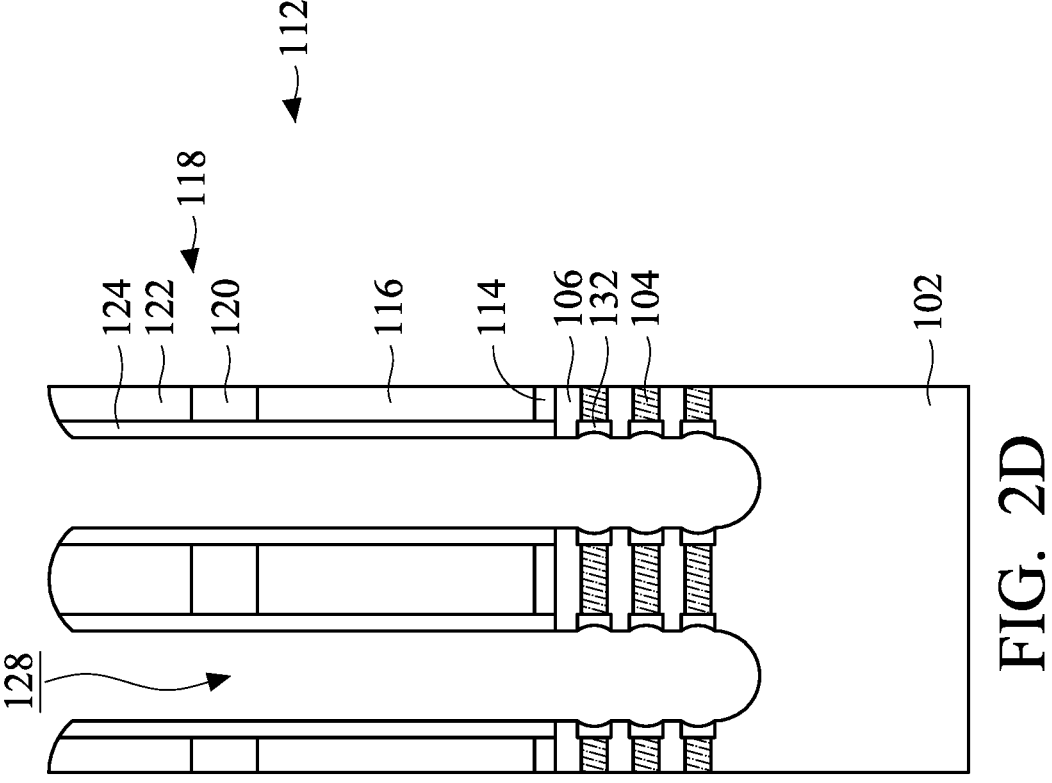
Figures 1, 2D:
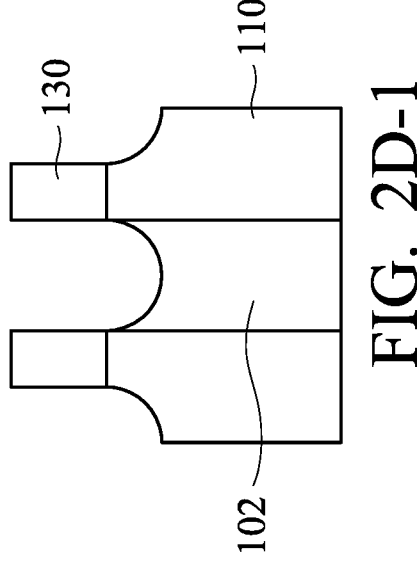

Afterwards, a wet etching process is performed, and the doped region 132d of the inner spacer layer 132 is removed, as shown in FIGS. 2D and 2D-1 in accordance with some embodiments. The inner spacer layer 132 may be laterally trimmed by a dry etching process, and the sidewalls of the spacer layer 124 and the second semiconductor material layers 106 are exposed. The inner spacer 132 may be formed in the recesses 152.

Since the inner spacer 132 is formed by implanting the conformally deposited inner spacer layer 132 and removing the doped region 132d of the inner spacer layer 132, the fin spacer 130 may remain its height.

Figure 2E:
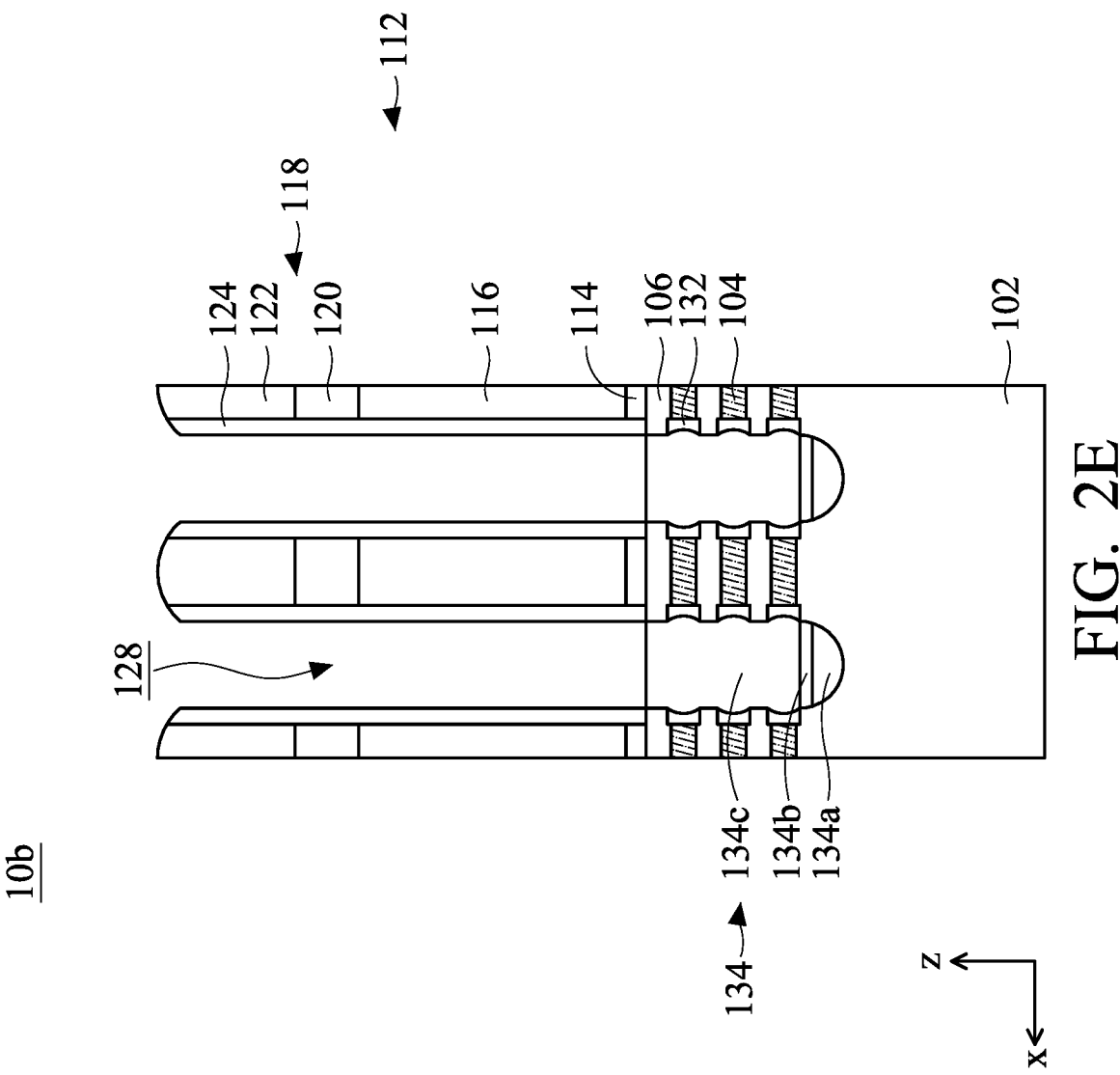
Figures 1, 2E:
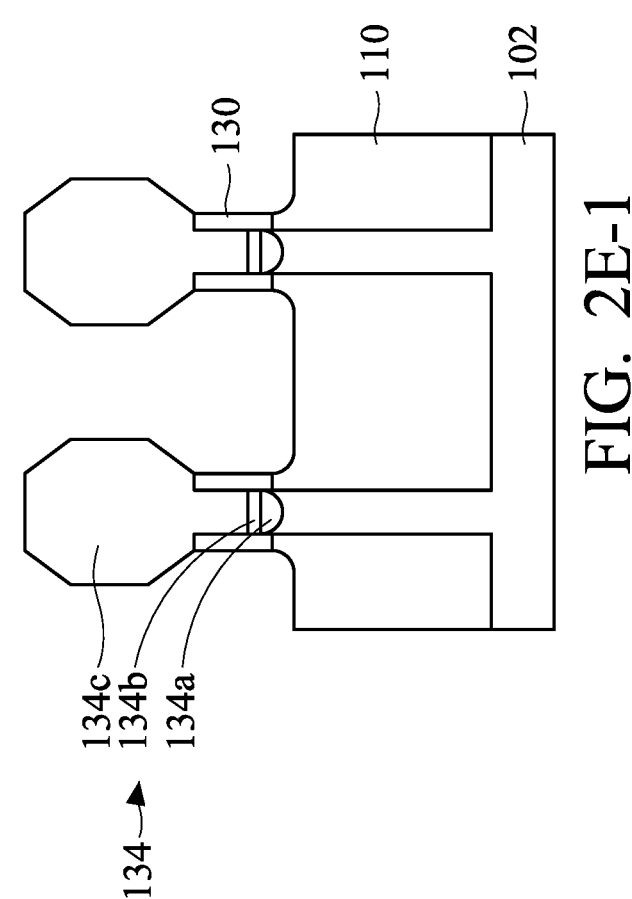

Next, the source/drain epitaxial structures 134 are formed in the source/drain recesses 128, as shown in FIGS. 2E and 2E-1 in accordance with some embodiments. Since the fin spacer 130 retains its height, the source/drain epitaxial structures 134 may be separated from each other.

By etching the inner spacer layer 132 with an implantation process and a wet etching process, the fin spacers 130 may be less consumed, and may be higher. Therefore, adjacent source/drain epitaxial structures 134 may be not merged, and the capacitance may be decreased.

Many variations and/or modifications may be made to the embodiments of the disclosure. FIGS. 3A, 3B, 3C, 3D, 3E are cross-sectional representations of various stages of forming a semiconductor device structure 10c, in accordance with some embodiments of the disclosure. FIGS. 3A-1, 3B-1, 3C-1, 3D-1, 3E-1 are cross-sectional representations of various stages of forming a semiconductor device structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIGS. 3A and 3C in accordance with some embodiments, both of the source/drain recesses 128 and the inner spacer 132 are formed by an implantation process and wet etching process.

Figures 1, 3A:
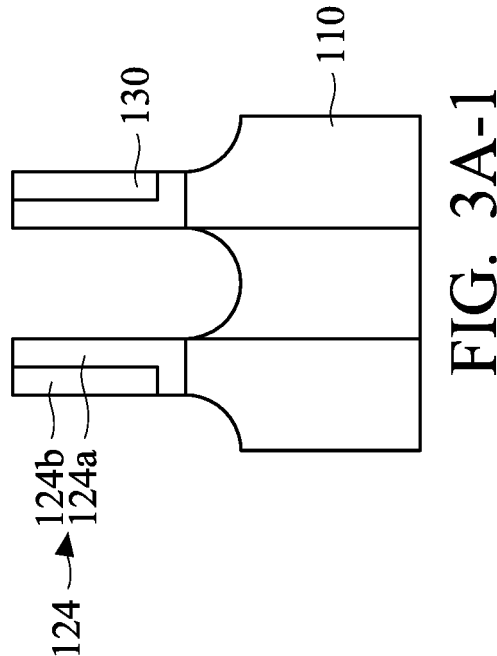

As shown in FIGS. 3A and 3A-1, the spacer layer 124 includes multiple spacer layers 124a and 124b. Since the source/drain recesses 128 is formed by an implantation process and wet etching process, the remaining fin spacer 130 may be higher.

Figure 3B:
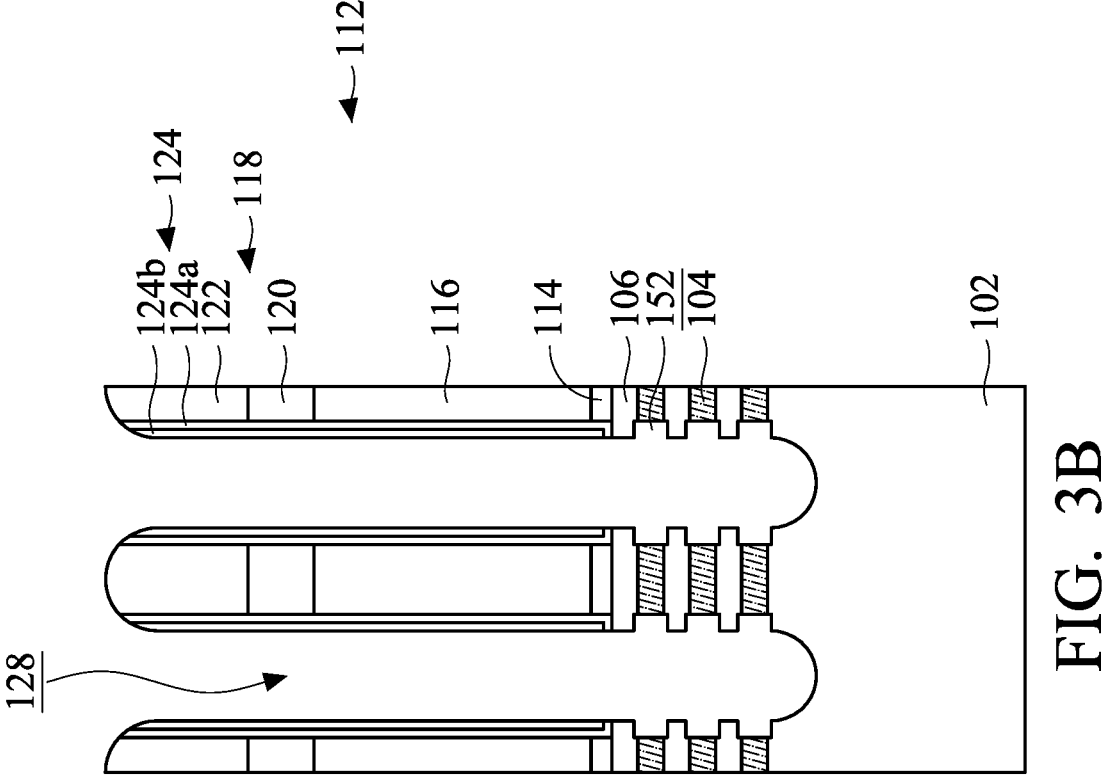
Figures 1, 3B:
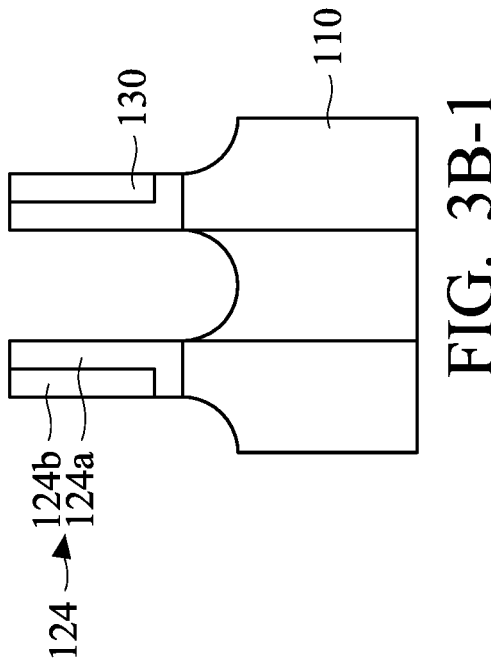
Figure 3C:
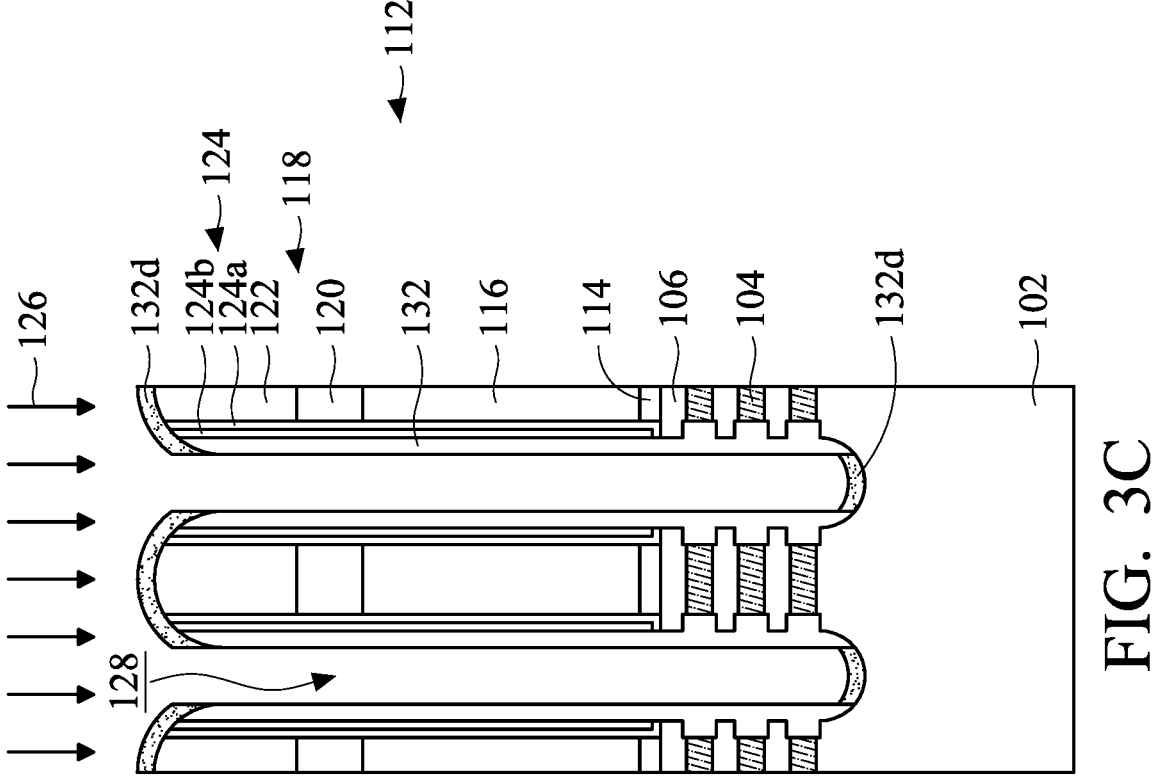
Figures 1, 3C:
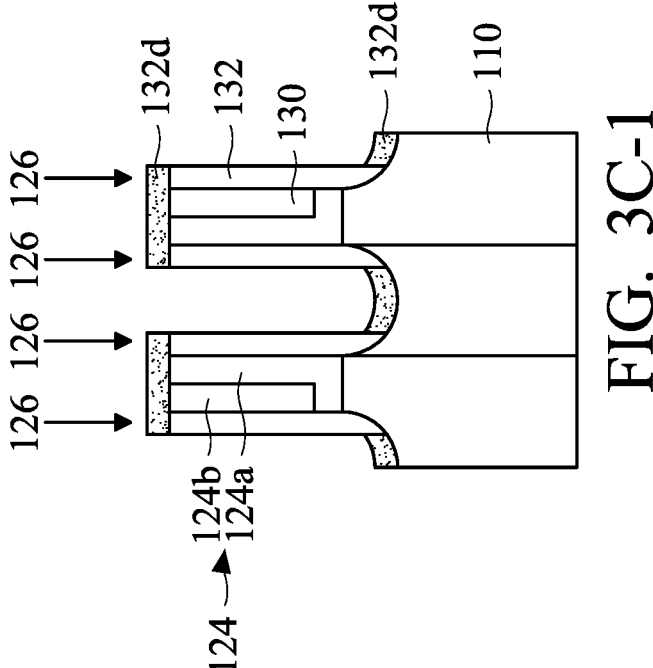
Figure 3D:
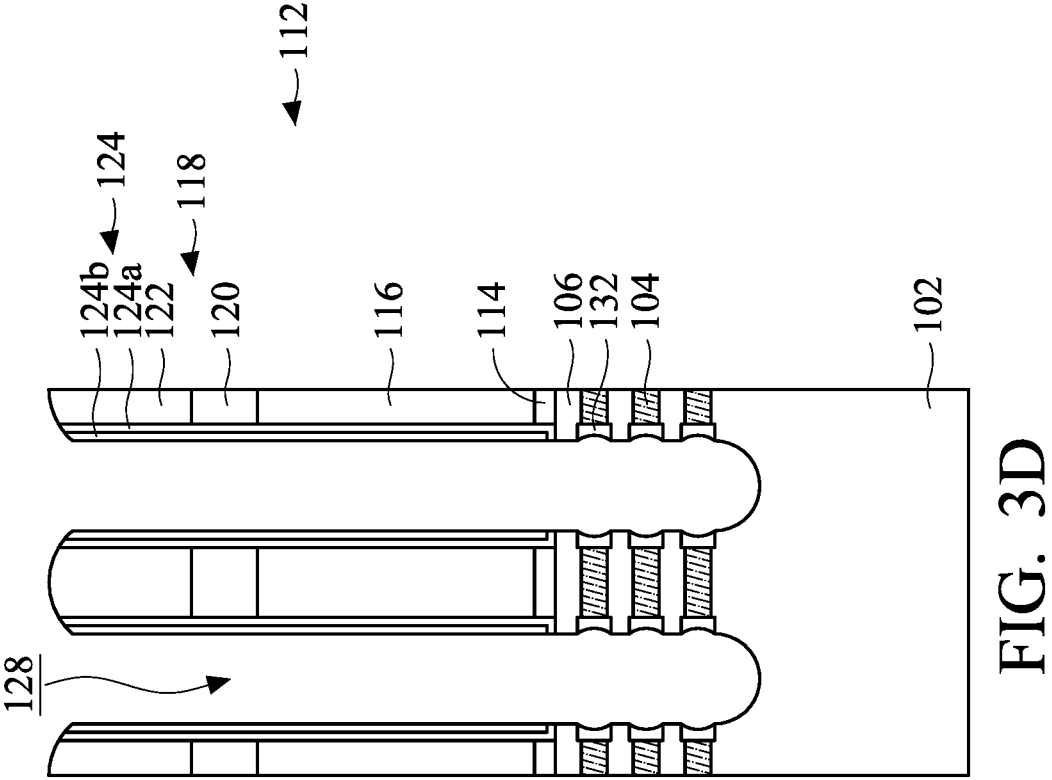
Figure 3D:
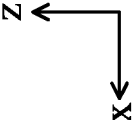
Figures 1, 3D:
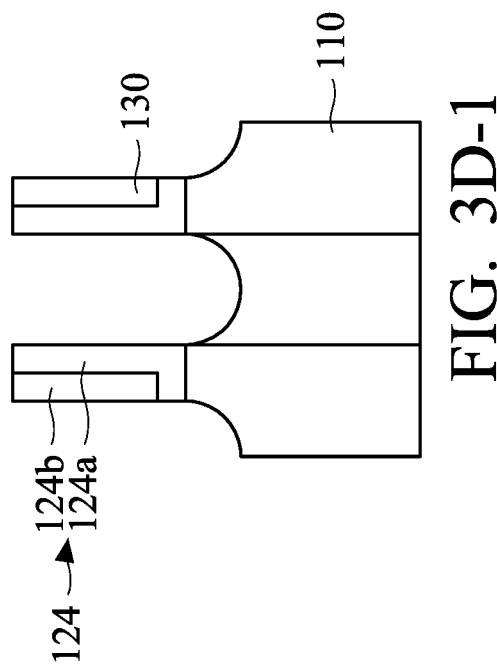
Figure 3E:
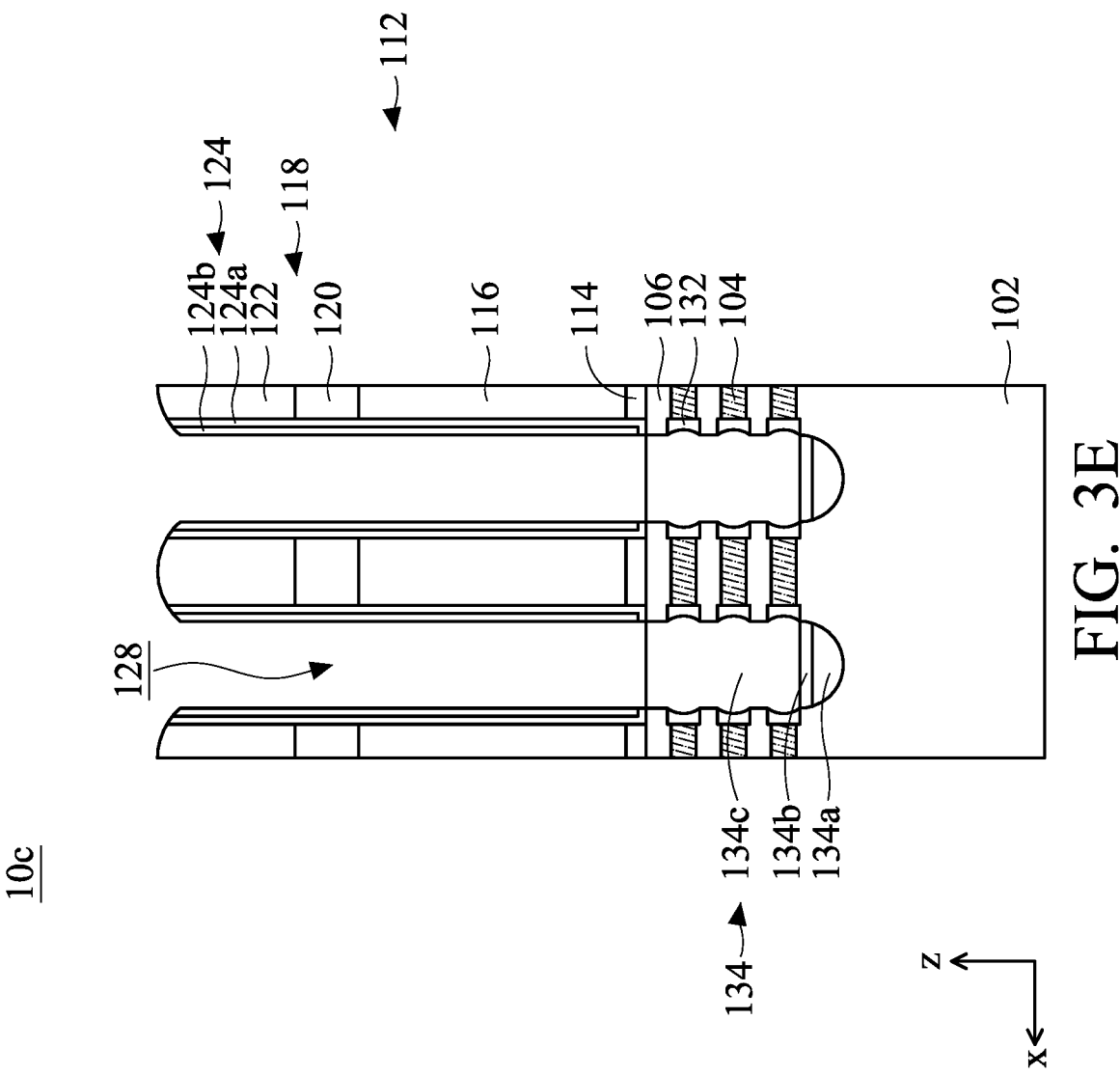
Figures 1, 3E:
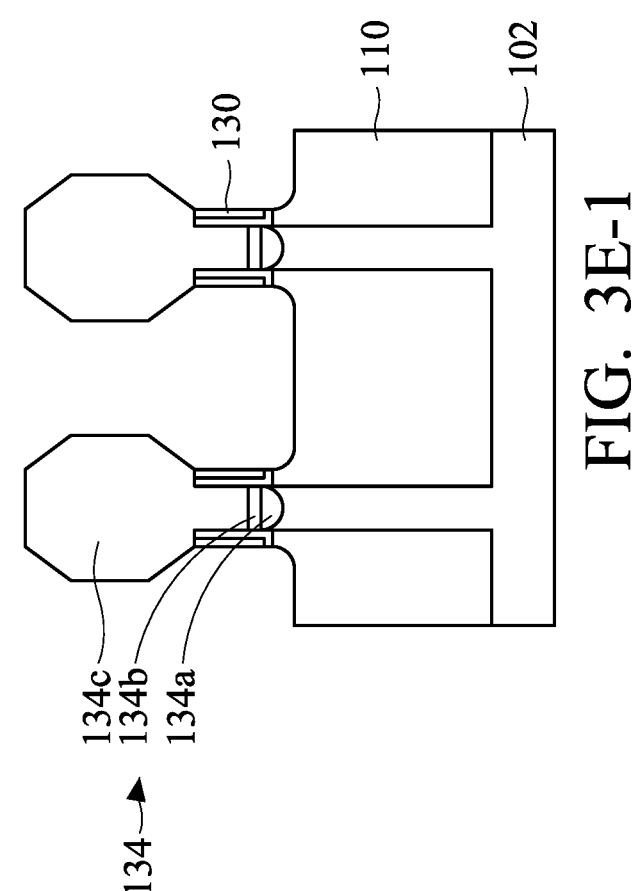

Later, the first semiconductor material layers 104 is laterally recessed, and recesses 152 are formed, as shown in FIGS. 3B and 3B-1 in accordance with some embodiments. Next, the inner spacer layer 132 is conformally deposited. An implantation process 126 is performed, and the doped region 132d of the inner spacer layer 132 is formed in the inner spacer layer 132, as shown in FIGS. 3C and 3C-1 in accordance with some embodiments. Afterwards, the doped region 132d of the inner spacer layer 132 is removed, and the inner spacer layer 132 is laterally trimmed, and the inner spacer 132 is formed in the recesses 152, as shown in FIGS. 3D and 3D-1 in accordance with some embodiments. Next, the source/drain epitaxial structures 134 are formed in the source/drain recesses 128, as shown in FIGS. 3E and 3E-1 in accordance with some embodiments. The processes and materials for forming the inner spacer 132 and the source/drain epitaxial structures 134 may be the same as, or similar to, those used for forming the inner spacer 132 and the source/drain epitaxial structures 134 in the previous embodiments. For the purpose of brevity, the descriptions of these processes are not repeated herein.

Since both of forming the source/drain recesses 128 and the inner spacer 132 include an implantation process and wet etching process, the height of the fin spacer 130 may remain. Higher fin spacer 130 may prevent source/drain epitaxial structures 134 from merging.

By forming the source/drain recesses 128 and etching the inner spacer layer 132 with an implantation process and a wet etching process, the fin spacers 130 may be less consumed, and may be higher. Therefore, adjacent source/drain epitaxial structures 134 may be not merged, and the capacitance may be decreased.

Figure 4A:
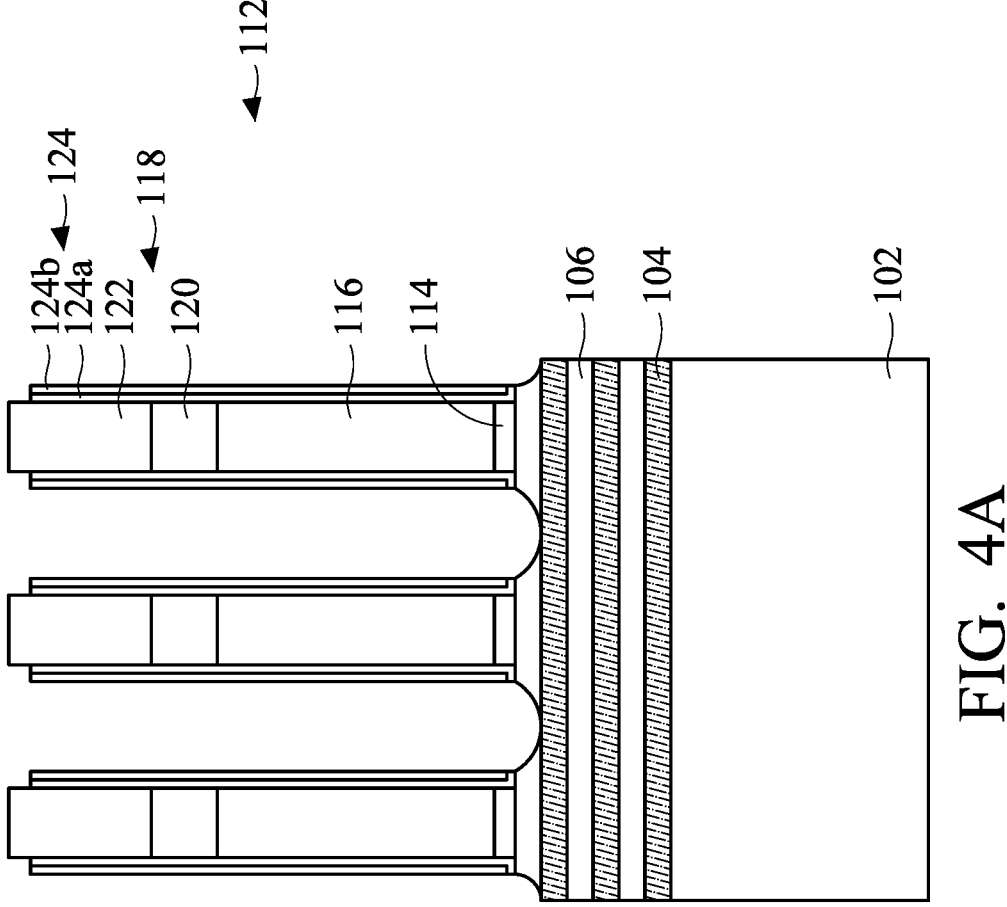
FIG. 4A is a cross-sectional representation of forming a semiconductor device structure, in accordance with some embodiments of the disclosure.
Figure 4A:
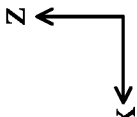
Figures 1, 4A:
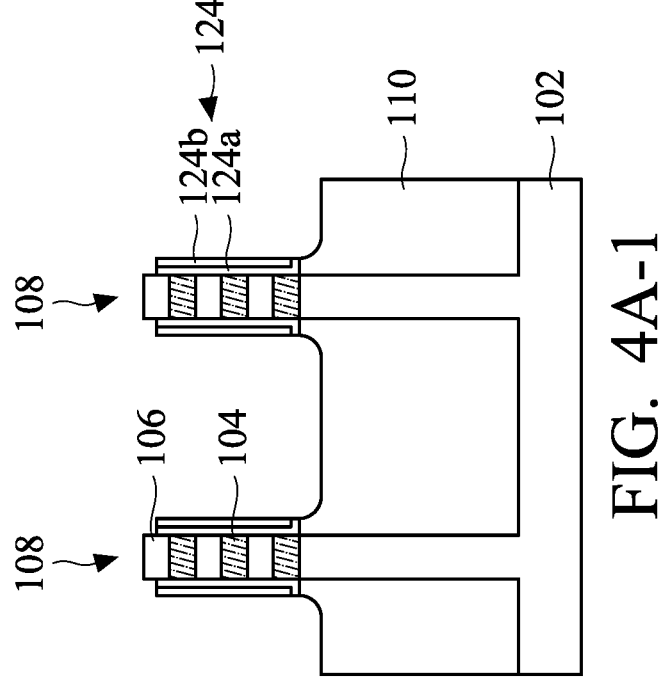
Figure 4B:
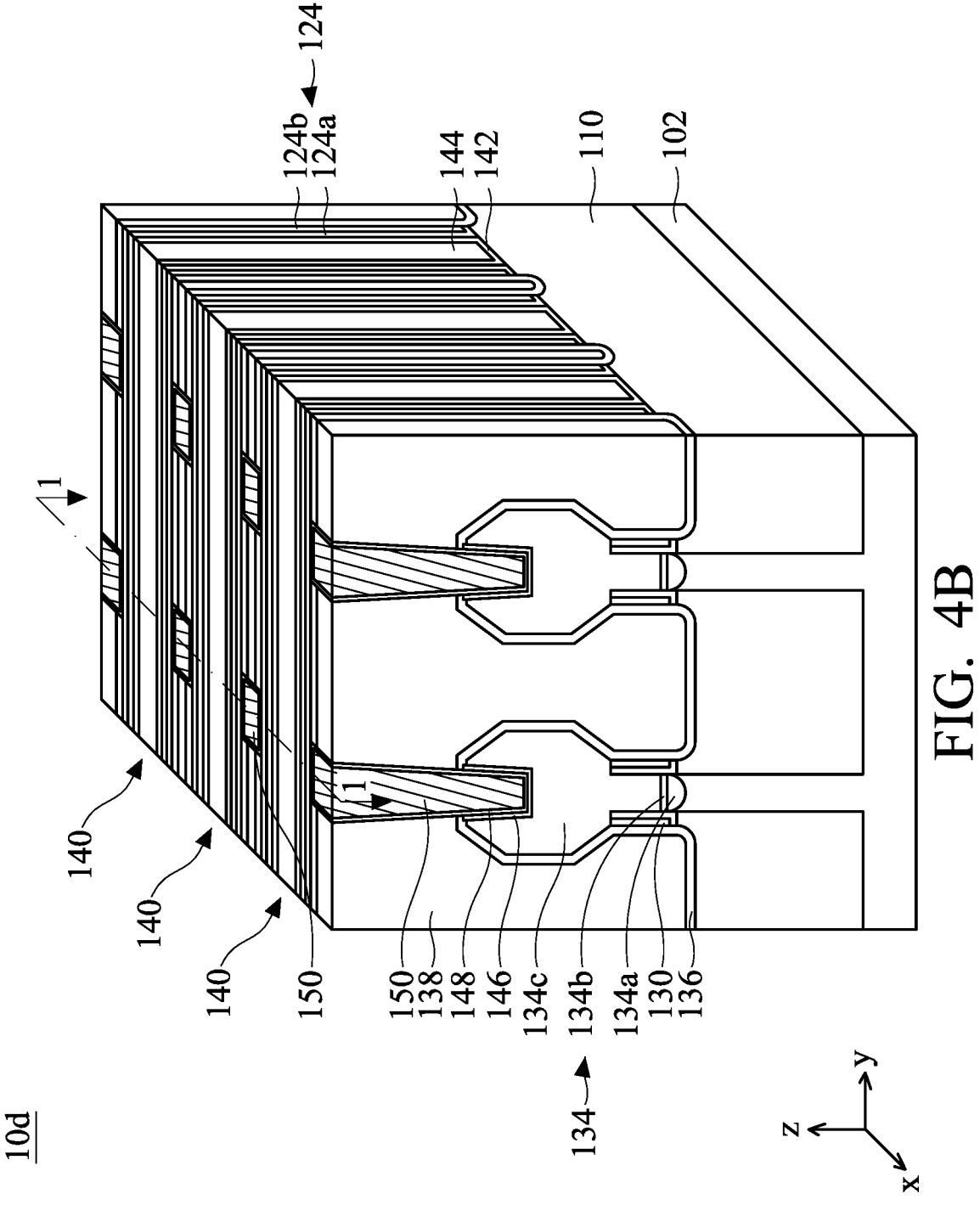
FIG. 4B is a perspective representation of forming a semiconductor device structure, in accordance with some embodiments of the disclosure.

Many variations and/or modifications may be made to the embodiments of the disclosure. FIGS. 4A, 4B are cross-sectional representations of various stages of forming a semiconductor device structure 10d, in accordance with some embodiments of the disclosure. FIG. 4A-1 is a cross-sectional representation of a semiconductor device structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIGS. 4A and 4A-1 in accordance with some embodiments, the top surfaces of the fin structures 108 and the isolation structure 110 are recessed when removing the doped region 124d of the spacer layer 124.

The second semiconductor material layers 106 and the isolation structure 110 may be consumed after the wet etching process for removing the doped region 124d of the spacer layer 124, as shown in FIGS. 4A and 4A-1 in accordance with some embodiments. Later, the isolation layer 110 is further etched when forming the source/drain recesses 128, as shown in FIG. 4B in accordance with some embodiments. The fin spacer 130 height remains, and the adjacent source/drain epitaxial structures 134 may be separated.

By forming the source/drain recesses 128 with an implantation process and a wet etching process, the fin spacers 130 may be less consumed, and may be higher. Therefore, adjacent source/drain epitaxial structures 134 may not be merged, and the capacitance may be decreased. The top surface of the isolation structure 110 may be recessed during the wet etching process.

As described previously, the source/drain recesses 128 are formed by implanting and wet etching the spacer layers 124. The fin spacers 130 may be less damaged, and may be higher. With higher fin spacers 130, the source/drain epitaxial structures 134 may be separated, and the capacitance may be decreased. In some embodiments as shown in FIG. 2C, the implantation and wet etching process may be also applied to the inner spacer layer 132. In some embodiments as shown in FIG. 3C, the implantation and wet etching process may be also applied to both of the spacer layers 124 and the inner spacer layers 132. In some embodiments as shown in FIG. 4A-1, the top surface of the isolation structure 110 is recessed during the wet etching process.

Embodiments of a semiconductor device structure and a method for forming the same are provided. The method for forming the semiconductor device structure may include implanting and wet etching spacer layers to achieve higher fin spacers. The source/drain epitaxial structures may be not merged, and the capacitance may be decreased.

In some embodiments, a method for forming a semiconductor device structure is provided. The method for forming a semiconductor device structure includes forming a fin structure extending in the first direction with alternating first semiconductor layers and second semiconductor layers stacked over a substrate. The method for forming a semiconductor device structure also includes forming a dummy gate structure across the fin structure and extending in the second direction. The second direction is different from the first direction. The method for forming a semiconductor device structure also includes depositing a spacer layer over the fin structure and the dummy gate structure. The method for forming a semiconductor device structure also includes implanting dopants into the spacer layer to form a first doped region vertically overlapping the dummy gate structure and a second doped region over the fin structure without vertically overlapping the dummy gate structure. The middle region of the spacer layer extends in a third direction to connect the first doped region to the second doped region. The method for forming a semiconductor device structure also includes removing the first doped region and the second doped region of the spacer layer. The method for forming a semiconductor device structure also includes forming a source/drain structure attached to the second semiconductor layers of the fin structure after removing the first doped region and the second doped region of the spacer layer. The method for forming a semiconductor device structure also includes removing the dummy gate structure and the first semiconductor layers of the fin structure. The method for forming a semiconductor device structure also includes forming a gate structure wrapped around the second semiconductor layers of the fin structure.

In some embodiments, a method for forming a semiconductor device structure is provided. The method for forming a semiconductor device structure includes forming a semiconductor stack with first semiconductor layers and second semiconductor layers alternately stacked over a substrate. The method for forming a semiconductor device structure also includes patterning the semiconductor stack to form a fin structure. The method for forming a semiconductor device structure also includes forming an isolation structure beside the bottom portion of the fin structure. The method for forming a semiconductor device structure also includes forming a dummy gate structure across the fin structure. The method for forming a semiconductor device structure also includes depositing a spacer layer over the dummy gate structure, the fin structure, and the isolation structure. The method for forming a semiconductor device structure also includes forming doped regions in the spacer layer over the dummy gate structure, the fin structure, and the isolation structure. The method for forming a semiconductor device structure also includes etching the doped regions of the spacer layer to expose the top surface of the isolation structure and to form gate spacers and fin spacers with the spacer layer. The method for forming a semiconductor device structure also includes etching the fin structure exposed by the dummy gate structure, the gate spacers, and the fin spacers to form source/drain recesses defined between the fin spacers. The method for forming a semiconductor device structure also includes growing an epitaxial structure in the source/drain recesses.

In some embodiments, a method for forming a semiconductor device structure is provided. The method for forming a semiconductor device structure includes alternately depositing first semiconductor layers and second semiconductor layers over a substrate. The method for forming a semiconductor device structure also includes forming fin structures with the first semiconductor layers and the second semiconductor layers. The method for forming a semiconductor device structure also includes forming an isolation structure with upper portions of the fin structures protruding from the top surface of the isolation structure. The method for forming a semiconductor device structure also includes forming dummy gate structures over the channel region of the fin structures and covering the top surface of the isolation structure. The method for forming a semiconductor device structure also includes conformally depositing a spacer layer over the substrate. The method for forming a semiconductor device structure also includes vertically implanting dopants into the spacer layer to form first doped regions in the channel regions and second doped regions in source/drain regions. The method for forming a semiconductor device structure also includes wet etching the first doped regions and the second doped regions of the spacer layer to form gate spacers. The method for forming a semiconductor device structure also includes forming recesses in the fin structures adjacent to the gate spacers. The method for forming a semiconductor device structure also includes forming epitaxial structures in the recesses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming a fin structure extending in a first direction with alternating first semiconductor layers and second semiconductor layers stacked over a substrate;

forming a dummy gate structure across the fin structure and extending in a second direction different from the first direction;

depositing a spacer layer over the fin structure and the dummy gate structure;

implanting dopants into the spacer layer to form a first doped region vertically overlapping the dummy gate structure and a second doped region over the fin structure without vertically overlapping the dummy gate structure, wherein a middle region of the spacer layer extends in a third direction to connect the first doped region to the second doped region;

removing the first doped region and the second doped region of the spacer layer;

forming a source/drain structure attached to the second semiconductor layers of the fin structure after removing the first doped region and the second doped region of the spacer layer;

removing the dummy gate structure and the first semiconductor layers of the fin structure; and forming a gate structure wrapped around the second semiconductor layers of the fin structure.

2. The method for forming the semiconductor device structure as claimed in claim 1, wherein implanting dopants into the spacer layer comprises substantially perpendicularly implanting the dopants into a top surface of the spacer layer.

3. The method for forming the semiconductor device structure as claimed in claim 1, wherein the first doped region and the second doped region of the spacer layer are removed by performing a wet etching process.

4. The method for forming the semiconductor device structure as claimed in claim 1, further comprising:

recessing the fin structure after removing the first doped region and the second doped region of the spacer layer.

5. The method for forming the semiconductor device structure as claimed in claim 1, further comprising:

laterally recessing the first semiconductor layers before depositing the spacer layer; and laterally trimming the spacer layer to expose the second semiconductor layers.

6. The method for forming the semiconductor device structure as claimed in claim 5, wherein the spacer layer is trimmed by performing a dry etching process.

7. The method for forming the semiconductor device structure as claimed in claim 1, wherein the spacer layer is a multi-layer structure.

8. A method for forming a semiconductor device structure, comprising:

forming a semiconductor stack with first semiconductor layers and second semiconductor layers alternately stacked over a substrate;

patterning the semiconductor stack to form a fin structure;

forming an isolation structure beside a bottom portion of the fin structure;

forming a dummy gate structure across the fin structure;

depositing a spacer layer over the dummy gate structure, the fin structure, and the isolation structure;

forming doped regions in the spacer layer over the dummy gate structure, the fin structure, and the isolation structure, wherein the doped region over the fin structure and the doped region over the isolation structure are separated by a first undoped region of the spacer layer;

etching the doped regions of the spacer layer to expose a top surface of the isolation structure and to form gate spacers and fin spacers with the spacer layer;

etching the fin structure exposed by the dummy gate structure, the gate spacers, and the fin spacers to form source/drain recesses defined between the fin spacers; and growing an epitaxial structure in the source/drain recesses.

9. The method for forming the semiconductor device structure as claimed in claim 8, further comprising:

forming recesses in the first semiconductor layers after forming the source/drain recesses;

conformally depositing an inner spacer layer in the source/drain recesses;

forming doped regions in the inner spacer layer over the dummy gate structure, the substrate, and the isolation structure;

wet etching the doped regions of the inner spacer layer; and dry etching the inner spacer layer.

10. The method for forming the semiconductor device structure as claimed in claim 9, wherein the doped regions of the inner spacer layer are in contact with the substrate before wet etching the doped regions of the inner spacer layer.

11. The method for forming the semiconductor device structure as claimed in claim 8, wherein a top surface of the isolation structure is recessed when etching the doped regions of the spacer layer.

12. The method for forming the semiconductor device structure as claimed in claim 8, wherein the spacer layer further comprises a second undoped region after forming the doped regions in the spacer layer, wherein the first undoped region of the spacer layer and the second undoped region of the spacer layer are on opposite sides of the fin structure.

13. The method for forming the semiconductor device structure as claimed in claim 8, wherein the spacer layer further comprises a third undoped region and a fourth undoped region after forming the doped regions in the spacer layer, wherein the third undoped region of the spacer layer and the fourth undoped region of the spacer layer are on opposite sides of the dummy gate structure and connected by the doped region of the spacer layer over the dummy gate structure.

14. A method for forming a semiconductor device structure, comprising:

alternately depositing first semiconductor layers and second semiconductor layers over a substrate;

forming fin structures with the first semiconductor layers and the second semiconductor layers;

forming an isolation structure with upper portions of the fin structures protruding from a top surface of the isolation structure;

forming dummy gate structures over a channel region of the fin structures and covering the top surface of the isolation structure;

conformally depositing a spacer layer over the substrate;

vertically implanting dopants into the spacer layer to form first doped regions in the channel regions and second doped regions in source/drain regions;

wet etching the first doped regions and the second doped regions of the spacer layer to form gate spacers;

forming recesses in the fin structures adjacent to the gate spacers; and forming epitaxial structures in the recesses.

15. The method for forming the semiconductor device structure as claimed in claim 14, wherein adjacent epitaxial structures are separated from each other.

16. The method for forming the semiconductor device structure as claimed in claim 14, further comprising:

forming third doped regions of the spacer layer in contact with the isolation structure.

17. The method for forming the semiconductor device structure as claimed in claim 16, further comprising:

removing the third doped portions of the spacer layer.

18. The method for forming the semiconductor device structure as claimed in claim 14, wherein a topmost surface of the gate spacers is lower than a topmost surface of the dummy gate structure.

19. The method for forming the semiconductor device structure as claimed in claim 14, wherein implanting the dopants into the spacer layer comprises implanting N, N2, Si, Ge, In, P, C, As, or a combination thereof.

20. The method for forming the semiconductor device structure as claimed in claim 14, wherein the second doped regions of the spacer layer cover top surfaces of the fin structures and extend onto upper portions of sidewalls of the fin structures.

\* \* \* \* \*